United States Patent
Surthi et al.

(10) Patent No.: US 10,923,480 B2
(45) Date of Patent: Feb. 16, 2021

(54) CAPACITANCE REDUCTION IN A SEMICONDUCTOR DEVICE

(71) Applicant: Micron Technology, Inc., Boise, ID (US)

(72) Inventors: Shyam Surthi, Boise, ID (US); Litao Yang, Boise, ID (US); Gurtej S. Sandhu, Boise, ID (US); Richard J. Hill, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/409,010

(22) Filed: May 10, 2019

(65) Prior Publication Data
US 2020/0357803 A1 Nov. 12, 2020

(51) Int. Cl.
| | | |
|---|---|---|
| H01L 29/06 | (2006.01) | |
| H01L 23/528 | (2006.01) | |
| H01L 21/768 | (2006.01) | |
| H01L 21/762 | (2006.01) | |
| H01L 29/66 | (2006.01) | |
| H01L 27/108 | (2006.01) | |

(Continued)

(52) U.S. Cl.
CPC .... *H01L 27/10885* (2013.01); *H01L 21/0206* (2013.01); *H01L 21/0217* (2013.01); *H01L 21/02164* (2013.01); *H01L 21/02532* (2013.01); *H01L 21/30604* (2013.01); *H01L 21/30625* (2013.01); *H01L 21/31116* (2013.01); *H01L 21/76802* (2013.01); *H01L 21/76877* (2013.01); *H01L 23/528* (2013.01); *H01L 23/5329* (2013.01); *H01L 23/53257* (2013.01); *H01L 27/10814* (2013.01); *H01L 27/10823* (2013.01); *H01L 27/10855* (2013.01); *H01L 27/10888* (2013.01)

(58) Field of Classification Search
CPC ........ H01L 23/53295; H01L 21/76835; H01L 21/31144; H01L 27/10885
See application file for complete search history.

(56) References Cited

U.S. PATENT DOCUMENTS

| | | |
|---|---|---|
| 7,662,693 B2 | 2/2010 | Bhattacharyya |
| 7,875,529 B2 | 1/2011 | Forbes et al. |

(Continued)

FOREIGN PATENT DOCUMENTS

KR  20130023805 A  *  3/2013

OTHER PUBLICATIONS

Machine translation of KR20130023805A (Year: 2013).*

*Primary Examiner* — Brian Turner
(74) *Attorney, Agent, or Firm* — Brooks, Cameron & Huebsch, PLLC

(57) ABSTRACT

Systems, apparatuses, and methods related to capacitance reduction in a semiconductor device are described. An example method may include forming an oxide only spacer over a portion of a sense line, formed on a semiconductor substrate, to separate the sense line from a storage node contact region of a semiconductor device and to reduce a capacitance between the sense line and the storage node contact region. The method may further include forming the storage node contact region in an active area of the semiconductor device neighboring the sense line and conductively connecting the sense line to the storage node contact region to enable a storage node to be sensed by the sense line.

29 Claims, 21 Drawing Sheets

(51) Int. Cl.
*H01L 21/02* (2006.01)
*H01L 21/311* (2006.01)
*H01L 21/306* (2006.01)
*H01L 23/532* (2006.01)

(56) References Cited

U.S. PATENT DOCUMENTS

| | | |
|---|---|---|
| 8,274,777 B2 | 9/2012 | Kiehlbauch |
| 2015/0235950 A1* | 8/2015 | Han .................. H01L 27/11 257/773 |
| 2020/0211769 A1* | 7/2020 | Diehl .................. C23C 14/042 |

* cited by examiner

CAPACITANCE REDUCTION IN A SEMICONDUCTOR DEVICE

TECHNICAL FIELD

The present disclosure relates generally to semiconductor devices and methods, and more particularly to capacitance reduction in a semiconductor device.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), static random access memory (SRAM), synchronous dynamic random access memory (SDRAM), ferroelectric random access memory (FeRAM), magnetic random access memory (MRAM), resistive random access memory (ReRAM), and flash memory, among others. Some types of memory devices may be non-volatile memory (e.g., ReRAM) and may be used for a wide range of electronic applications in need of high memory densities, high reliability, and low power consumption. Volatile memory cells (e.g., DRAM cells) require power to retain their stored data state (e.g., via a refresh process), as opposed to non-volatile memory cells (e.g., flash memory cells), which retain their stored state in the absence of power. Various volatile memory cells, such as DRAM cells may be operated (e.g., programmed, read, erased, etc.) faster than various non-volatile memory cells, such as flash memory cells. Conditions that affect conduct of electricity and storage of charge also may affect operation of the various types of semiconductor memory and electronic devices.

DETAILED DESCRIPTION

Figure 1A:
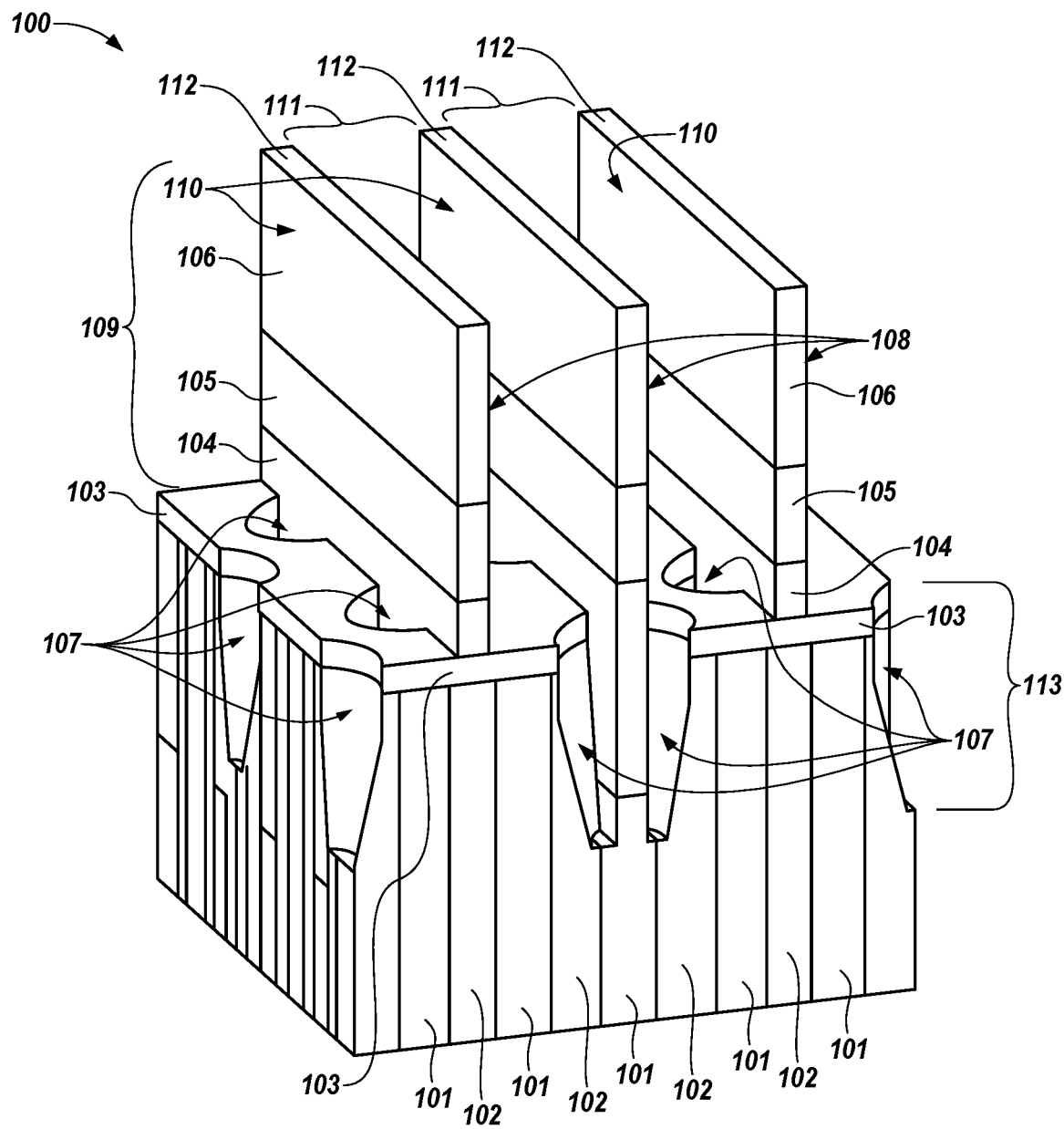
FIGS. 1A-1O illustrate perspective views of a portion of an example semiconductor device at various points in time in an example fabrication sequence for capacitance reduction in accordance with a number of embodiments of the present disclosure.

Various types of memory and electronic devices may be formed from various semiconductor materials and may have conductive pathways to enable access to and control of various components. The conductive pathways may include electrodes, access lines (e.g., word lines), and sense lines (e.g., bit lines), among other possible conductive pathways, to conduct electricity and/or electronic signals, such as instructions and/or data. The components accessible via the conductive pathways may include control circuitry, sense amplifiers, memory cells, transistors, and capacitors, among other possible components.

Various materials may be used as, or as part of, semiconductors, conductors, resistors, capacitors, transistors, etc., and in conductive pathways for various types of memory and electronic devices. As electronic components that include these materials become positioned progressively closer together (e.g., the critical dimensions (CDs) become smaller) capacitive coupling may occur that produces, or increases, an unintended capacitance between the components. Such capacitance may contribute to unnecessary noise and/or interference. For example, noise and/or interference caused by capacitive coupling may affect ability of a sense line (e.g., including a conductor) of a memory device to enable accurate sensing of a data value in a storage node (e.g., including a capacitor) through a storage node contact region (e.g., including a semiconductor such as a doped silicon).

When small CDs of a semiconductor device interfere with providing enough room for physically spacing the components to overcome capacitive coupling between them, a spacer material may be positioned between the components to reduce (e.g., prevent) the capacitive coupling. Some spacer materials (e.g., chemical compounds) may be more effective than others in reducing the capacitive coupling. However, a more effective spacer material may be more susceptible than a less effective spacer material to unintended consequences of downstream operations (e.g., removal by etch processes, chemical mechanical planarization (CMP), etc.) in a fabrication sequence for the semiconductor device. For example, an oxide material (e.g., silicon monoxide (SiO), and silicon dioxide $SiO_2$), among other possible oxides) of a particular thickness may be more effective at reducing capacitance and/or capacitive coupling than a nitride material (e.g., silicon nitride ($Si_3N_4$), among other possible nitrides) of that thickness. However, relative to the more thermodynamically stable $Si_3N_4$, $SiO_2$ may be more susceptible to unintended removal by the downstream operations. Hence, as described herein, it may be advantageous to use an oxide material as the spacer and to adapt the fabrication sequence to reduce exposure of the oxide material to the downstream operations.

Accordingly, the present disclosure includes systems, apparatuses, and methods related to capacitance reduction in a semiconductor device. An example method may include forming an oxide only spacer over a portion of a sense line, formed over a semiconductor substrate, to separate the sense line from a storage node contact region of the semiconductor device and to reduce a capacitance between the sense line and the storage node contact region. The method may further include forming the storage node contact region in an active area of the semiconductor device neighboring the sense line and conductively connecting the sense line to the storage node contact region to enable a storage node to be sensed by the sense line. The oxide only spacer may be protected from unintended consequences following formation and during subsequent processing by, in a number of embodiments, a nitride material (e.g., $Si_3N_4$) being used as a cap over the oxide material (e.g., $SiO_2$) of the sense line during such processing.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the figure number of the drawing and the remaining digits identify an element or component in the drawing. Similar elements or components between different figures may be identified by the use of similar digits. For example, 151 may reference element "51" in FIG. 1O, and a similar element may be referenced as 251 in FIG. 2. In some instances, a plurality of similar, but functionally and/or structurally distinguishable, elements or components in the same figure or in different figures may be referenced with a single element number (e.g., 103, 104, 105, 106, etc., in FIGS. 1A, 1B, . . . , 1O) and/or sequentially with the same element number (e.g., 708-1 and 708-2 in FIG. 7).

FIG. 1A illustrates a perspective view of example structural features 100 of a portion of an example semiconductor device at a particular point in time in an example fabrication sequence for capacitance reduction in accordance with a number of embodiments of the present disclosure. The semiconductor devices described herein may include the example memory devices shown at 261, 698, and 763 and described in connection with FIGS. 2, 6, and 7, respectively, although embodiments are not intended to be limited to these types of memory devices.

The structural features 100 illustrated in FIG. 1A are shown at a point in time that corresponds to processing activities already having been performed in the fabrication sequence. The portion of the structural features 100 illustrated in FIG. 1A show a structural configuration at a comparative baseline for capacitance reduction as described herein. The structural features illustrated in FIGS. 1B, . . . , 1O are shown at points in time after various other processing activities have been performed along the fabrication sequence. Other structural features and processing activities may have been omitted from FIGS. 1A-1O for simplicity.

The illustrated structural features and processing activities may correspond to formation and removal of structural features. For example, in a number of embodiments, the structural features may be formed using deposition processes such as diffusion, spin-on deposition, physical vapor deposition, chemical vapor deposition, plasma-enhanced chemical vapor deposition, pulsed laser deposition, sputter deposition, atomic layer deposition, among other suitable deposition processes. Alternatively or in addition, the structural features may be formed using atomic layer epitaxy. Subtractive etch process (e.g., any suitable wet etch or dry etch process) may be used to remove specific portions of the various materials such that the remaining materials contribute to formation of the intended components. Alternatively or in addition, additive (e.g., damascene) deposition processes may be used to form the structural features. The damascene process may, for example, use CMP instead of a subtractive etch process.

An example system 580 that may be used for such processing activities is shown and described in connection with FIG. 5. The various processing activities may, in a number of embodiments, be performed using the single system 580 illustrated in FIG. 5 or may be performed using a plurality of such systems that are each capable of performing particular activities in the fabrication sequence. For example, portions of the fabrication sequence that use a wet etch process may be performed in one part of the processing system and other portions of the fabrication sequence that use a dry etch process conducted in a vacuum may be performed in another part of the processing system.

Formation of the structural features 100 illustrated in FIG. 1A may, for example, include formation (e.g., deposition) of sense line pillars 108 in association with a working surface 103 during formation of the semiconductor device. The working surface 103 may be formed from a semiconductor material (e.g., $SiO_2$, $Si_3N_4$, among other possible oxides and/or nitrides).

Each of the sense line pillars 108 may, in a number of embodiments, include a portion that functions as a sense line 105 for the semiconductor device. The sense lines 105 each be may be formed from a conductive material. Examples of such conductive materials that may be included in the sense lines 105 may include one or more of iron (Fe), cobalt (Co), nickel (Ni), copper (Cu), molybdenum (Mo), tungsten (W), rhenium (Re), and mercury (Hg), among other suitable conductive materials.

A portion of each sense line pillar 108 opposite from working surface 103 and adjacent the sense line 105 may include an insulation region 106. The insulation region 106 may be formed from an insulation material. The insulation material may be resistant to unintended consequences (e.g., removal) during etching, cleaning, etc., processes performed during formation of the semiconductor device and may protect the conductive material of the underlying sense line 105 from exposure to such processes. The insulation material also may function as an insulator, resistor, and/or dielectric following completion of the semiconductor device to reduce drain of current and/or charge from the sense line 105 during operation of the semiconductor device. Examples such insulation materials that may be included in the insulation regions 106 may include one or more nitrides selected from boron nitride (BN), silicon nitride ($SiN_X$, $Si_3N_4$), silicon carbon nitride (SiCN), silicon boron nitride (SiBN), among other possibilities, for formation of the insulation region 106.

In a number of embodiments, each of the sense line pillars 108 may include a portion 104 formed from a semiconductor material. The portion 104 formed from the semiconductor material may be adjacent the sense line 105 on a side opposite from the insulation region 106. The portion 104 formed from the semiconductor material may be, or may include, a doped silicon formed over (e.g., on), to extend into, or to extend through an opening in the working surface 103. Adding impurities (e.g., atoms and/or ions) to dope a semiconductor upsets its bonds and frees electrons. Freeing the electrons makes a semiconductor (e.g., undoped silicon) more conductive. Doped silicon can become an n-type semiconductor or a p-type semiconductor.

The portions 104 formed from the doped silicon may intersect with (e.g., be coupled to) columns 101 below the working surface 103. The columns 101 may be formed from undoped silicon. Examples of undoped silicon may include relatively inert monocrystalline silicon (monosilicon), polycrystalline silicon (polysilicon), and amorphous silicon, among other possibilities. Alternatively or in addition, the portions 104 may intersect with columns 102 below the working surface 103 that may be formed from an oxide material (e.g., SiO, and SiO$_2$, among other possible oxides). The undoped silicon columns 101 and the oxide columns 102 may be alternately positioned adjacent one another. In some embodiments, a semiconductor device as described herein may be formed over (e.g., on) a semiconductor substrate (e.g., a relatively inert undoped silicon as shown at 724 in FIG. 7).

Each of the sense line pillars 108 may be formed to a particular height 109 from an upper surface of the working surface 103 to a top 112 of the insulation region 106. The height 109 may be in a range of from around 100 nanometers (nm) to around 300 nm. Each of the sense line pillars 108 may have a substantially vertical surface 110, relative to the working surface 103, on each side of the sense line pillar 108. The vertical surfaces 110 may include two substantially vertically exposed sides of the insulation region 106, the sense line 105, and the portion 104 formed from doped silicon for each of the sense line pillars 108 that extend above the upper surface of the working surface 103. The sense line pillars 108 may be formed in a substantially parallel configuration to extend along the working surface 103. One sense line pillar 108 may be separated by a space 111 from another sense line pillar 108. The space 111 may have a width in a range of from around 30 nm to around 120 nm.

One or more trenches 107 may be formed adjacent each of the sense line pillars 108. The trenches 107 may be formed (e.g., by an etch process) through the working surface 103 and into the undoped silicon columns 101 and/or the oxide columns 102 to a particular depth 113 below the upper surface of the working surface 103. A trench 107 may, for example, be formed in a semicircular configuration through the working surface 103 to have a vertical wall along a face of the portion 104 of the sense line pillar 108 formed from doped silicon that extends through and to a particular depth below the working surface 103, although the trenches described herein are not so limited.

Figure 1B:
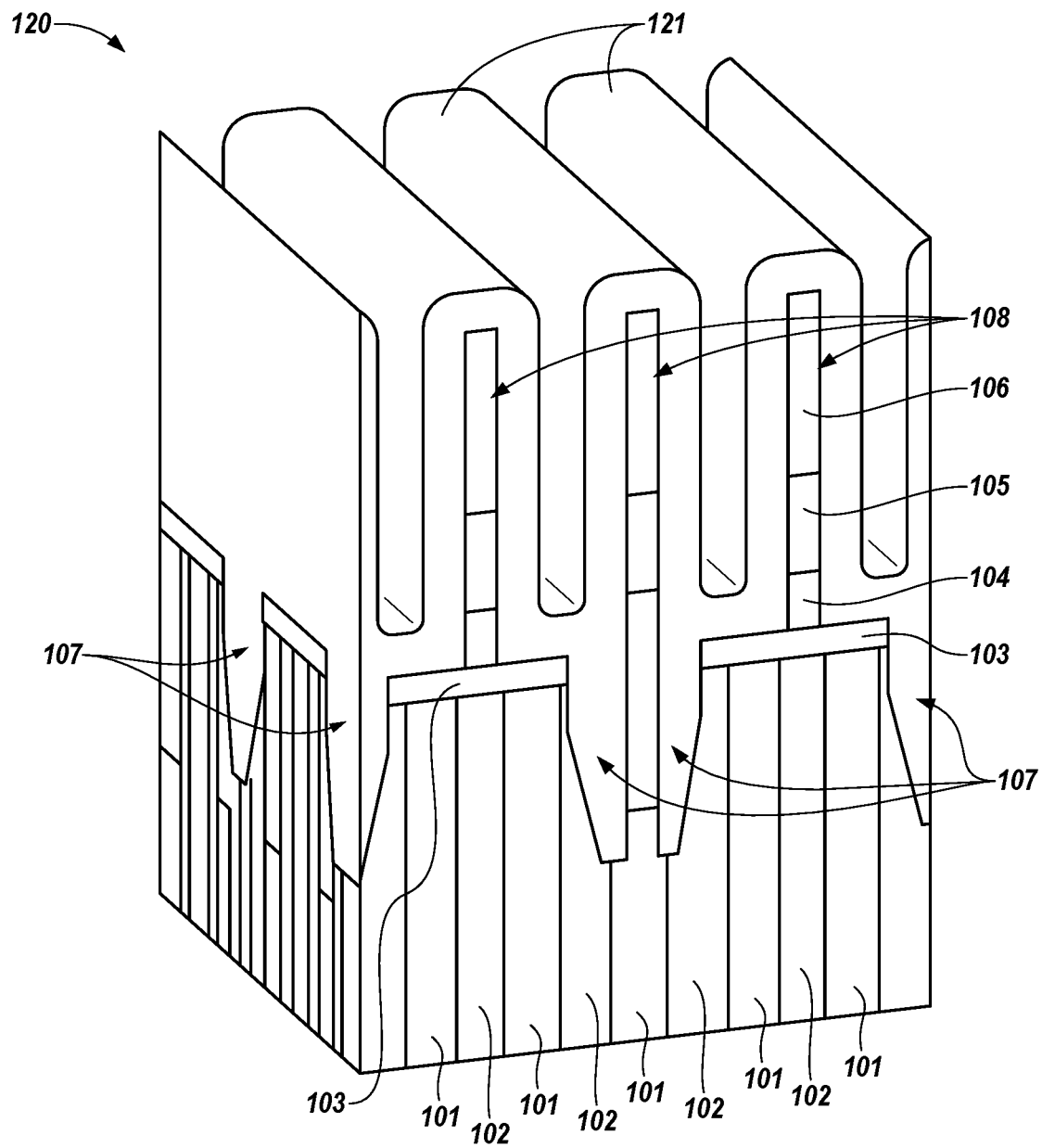

FIG. 1B illustrates a perspective view of example structural features 120 at a particular point in time after that shown in FIG. 1A in the example fabrication sequence in accordance with a number of embodiments of the present disclosure.

FIG. 1B shows that a nitride material 121 has been deposited over (e.g., on) the structural features 100 shown and described in connection with FIG. 1A. The nitride material 121 may, in a number of embodiments, be the same as one or more of the insulation materials described herein. For example, the nitride material 121 may be formed from Si$_3$N$_4$, although embodiments are not so limited. The nitride material 121 may be deposited over (e.g., to cover) each of the sense line pillars 108. As such, for each sense line pillar 108, the nitride material 121 may be deposited over the top 112 of the insulation region 106 and over the vertical surfaces 110 of the insulation region 106, the sense line 105, and the portion 104 formed from doped silicon. The nitride material 121 also may be deposited over the upper surface of the working surface 103 in the spaces 111 between the sense line pillars 108. The nitride material 121 may be deposited to a thickness in a range of from around 5 nm to around 20 nm. In addition, the nitride material 121 may be deposited to fill each of the trenches 107 to the particular depth 113.

Figure 1C:
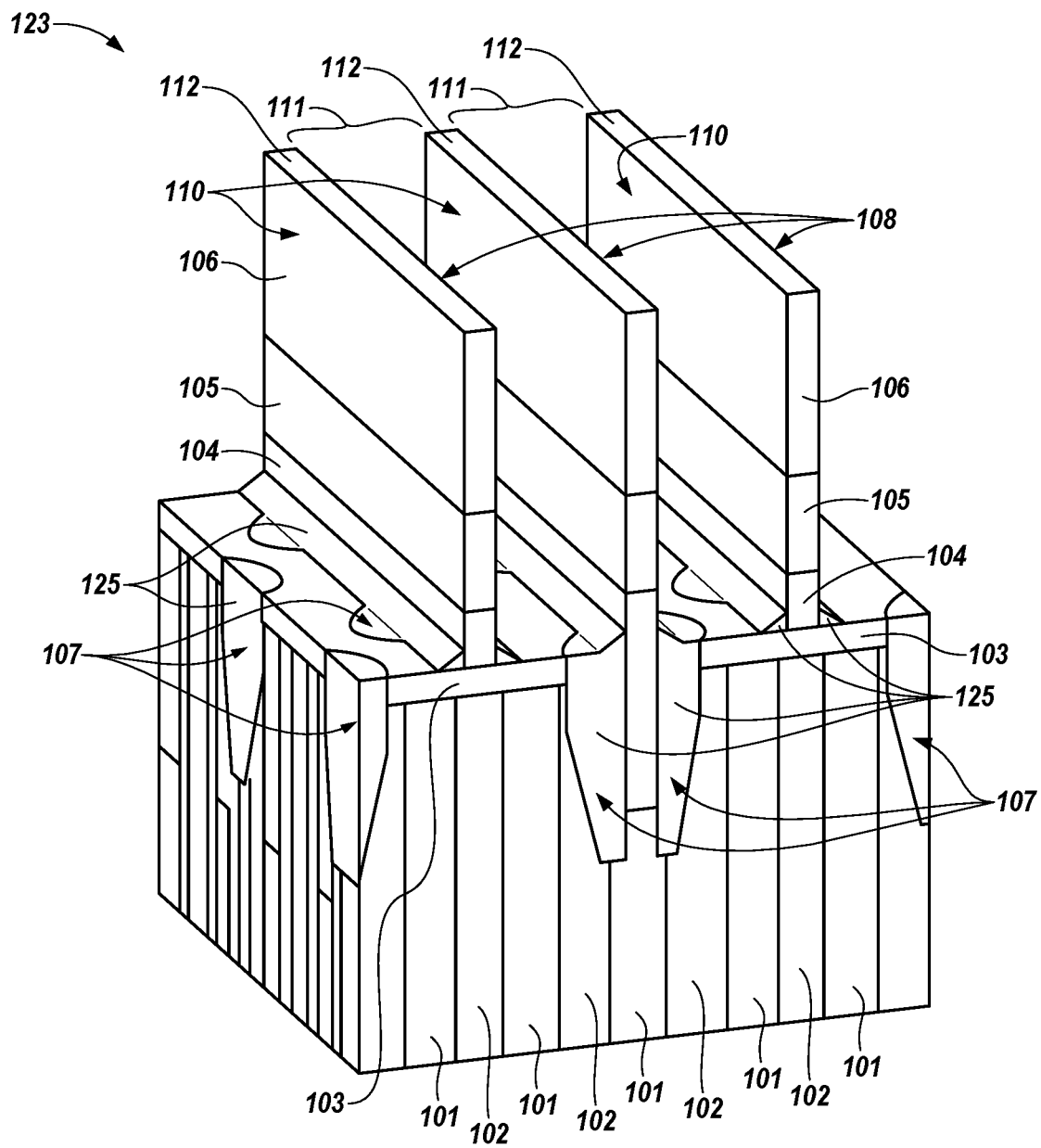

FIG. 1C illustrates a perspective view of example structural features 123 at a particular point in time after that shown in FIG. 1B in the example fabrication sequence in accordance with a number of embodiments of the present disclosure.

The structural features 123 illustrated in FIG. 1C are shown following removal of a portion of the nitride material 121 (e.g., by performance of a conformal and selective dry or wet etch process). As a result, the top 112 of the insulation region 106 and the vertical surfaces 110 of the insulation region 106, the sense line 105, and at least some of the portion 104 formed from doped silicon of each sense line pillar 108 may be re-exposed. Most of the upper surface of the working surface 103 in the spaces 111 between the sense line pillars 108 may also be re-exposed by removal of the portion of the nitride material 121. The removal of the portion of the nitride material 121 may be performed to leave another portion 125 of the nitride material 121 so that the trenches 107 remain filled. Performance of the etch process also may, in a number of embodiments, leave some of the nitride material 125 on each side of the vertical surfaces 110 at an intersection of the portions 104 of the sense line pillars 108 and the upper surface of the working surface 103 in the spaces 111. As such, at least some of both sides of the portion 104 of each sense line pillar 108, the filled trenches 107, and/or the working surface 103 in the spaces 111 may remain covered by remaining nitride material 125.

Figure 1D:
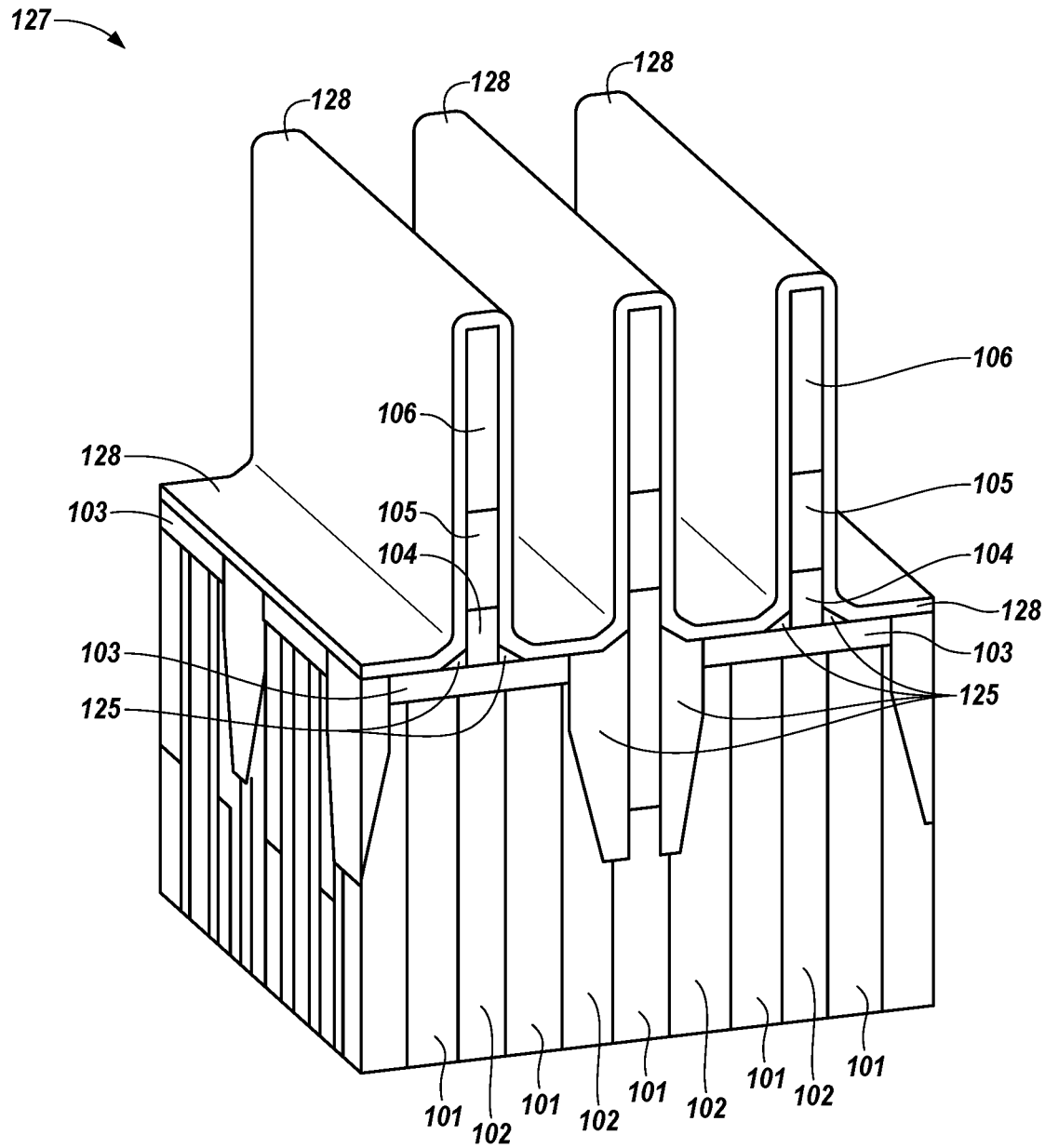

FIG. 1D illustrates a perspective view of example structural features 127 at a particular point in time after that shown in FIG. 1C in the example fabrication sequence in accordance with a number of embodiments of the present disclosure.

FIG. 1D shows the structural features 123 illustrated in FIG. 1C following formation of a first oxide material 128 over the exposed surfaces of the top 112 of the insulation region 106 and the vertical surfaces 110 of the insulation region 106, the sense line 105, and the portion 104 formed from doped silicon of each sense line pillar 108. The first oxide material 128 also is shown to be formed over the exposed surfaces of the working surface 103 in the spaces 111, the nitride material 125 in the filled trenches 107, and the remaining nitride material 125.

The first oxide material 128 may be formed from one or more of SiO, SiO$_2$, tungsten oxide (WO$_3$), and silicon oxynitride (SiON), among other suitable oxide materials. The first oxide material 128 may, in a number of embodiments, be deposited by performance of a conformal deposition process (e.g., a dry deposition process). Deposition of the first oxide material 128 may, for example, be performed under reducing conditions (e.g., in the presence of a high concentration of hydrogen, nitrogen, and/or an inert gas relative to oxygen). Such reducing conditions may reduce (e.g., prevent) oxidation of the structural features 127 shown in FIG. 1D (e.g., Fe, Cu, W, etc., in the sense lines 105). The first oxide material 128 may be formed (e.g., deposited) to a thickness in a range of from around 2 nm to around 10 nm. Deposition of the first oxide material 128 as such may, in a number of embodiments, be performed in a same chamber 582 of a processing apparatus 581 (e.g., as are shown and described in connection with FIG. 5) as is used for performance of other portions of the fabrication sequence or deposition of the first oxide material 128 as such may be performed in a different chamber 582.

Figure 1E:
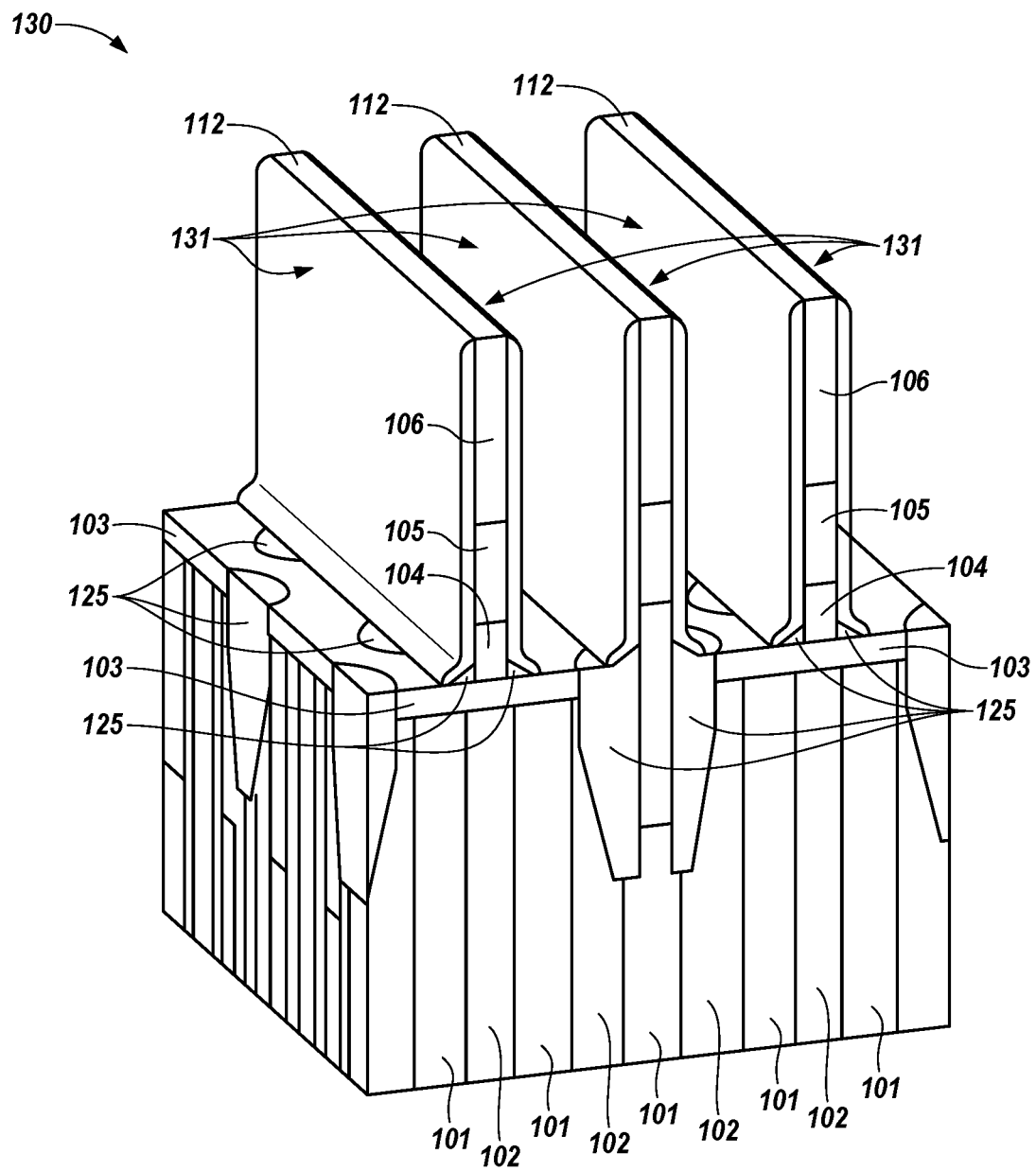

FIG. 1E illustrates a perspective view of example structural features 130 at a particular point in time after that shown in FIG. 1D in the example fabrication sequence in accordance with a number of embodiments of the present disclosure.

FIG. 1E shows the structural features 127 illustrated in FIG. 1D following removal of a portion of the first oxide material 128. Removing the portion of the first oxide material 128 may re-expose the top 112 of the insulation region 106, some of the working surface 103 in the spaces 111, and some of the nitride material 125 in the filled trenches 107. Removing the portion of the first oxide material 128 may leave a remaining portion 131 of the first oxide material 128 to cover the vertical surfaces 110 of the insulation region 106, the sense line 105, the portion 104 formed from doped silicon, and the remaining nitride material 125 on both sides of each sense line pillar 108.

Removing the portion of the first oxide material 128 may be performed using a conformal dry etch process that may be selective to the first oxide material 128. As a result, the remaining portion 131 may be thinner than the 2-10 nm thickness of the originally deposited first oxide material 128.

Figure 1F:
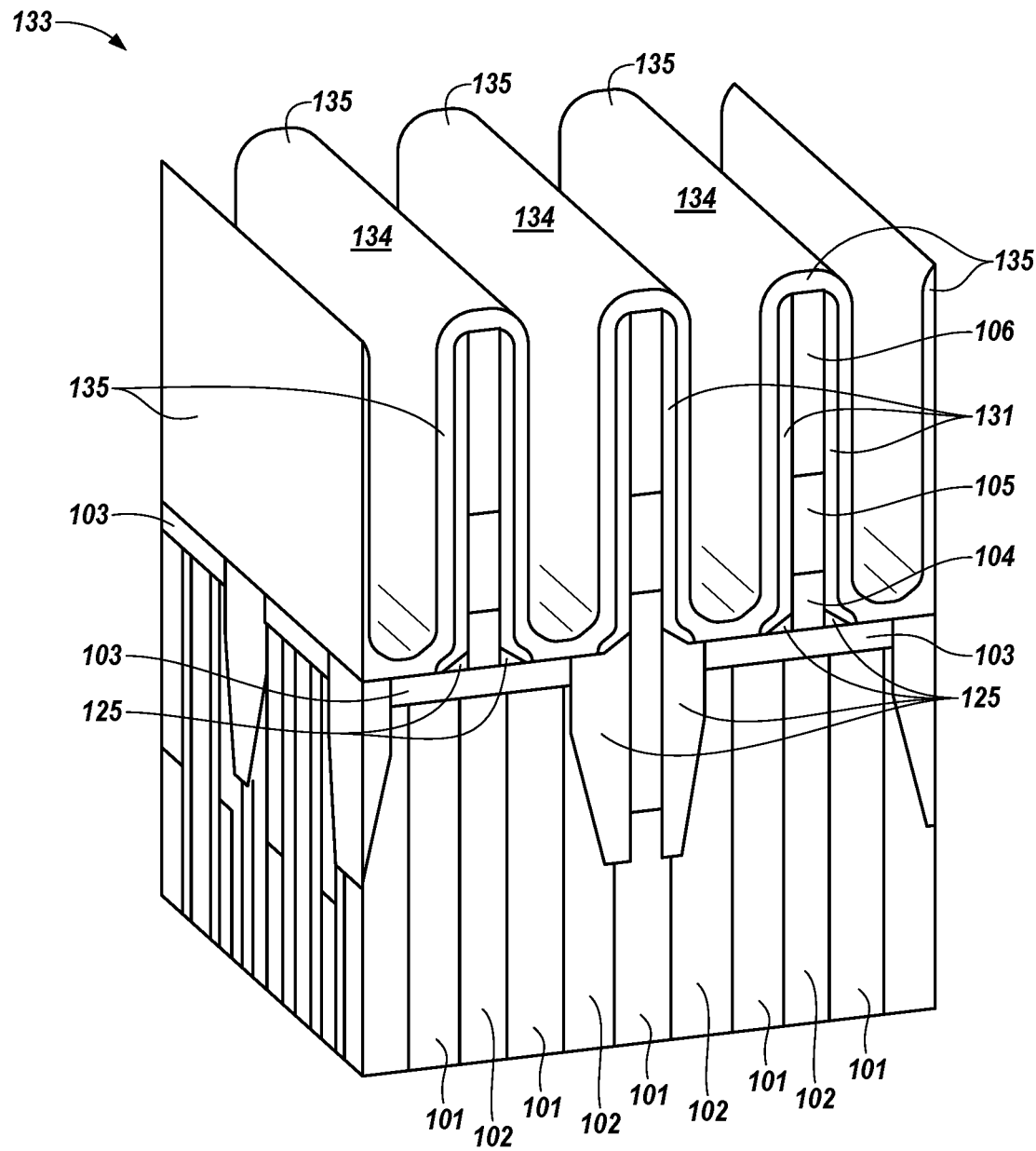

FIG. 1F illustrates a perspective view of example structural features 133 at a particular point in time after that shown in FIG. 1E in the example fabrication sequence in accordance with a number of embodiments of the present disclosure.

FIG. 1F shows the structural features 130 illustrated in FIG. 1E following formation (e.g., by a conformal wet or dry deposition process) of a nitride material 134 as a cap 135. The cap 135 shown in Figure F may be formed to cover exposed surfaces of the tops 112 of the insulation regions 106 and the remaining portions 131 of the first oxide material 128 that cover the vertical surfaces 110 of the insulation regions 106, the sense lines 105, the portions 104 formed from doped silicon, and the remaining nitride materials 125 on both sides of each sense line pillar 108. The cap 135 also may cover of the working surface 103 in the spaces 111 and the nitride material 125 in the filled trenches 107.

The cap 135 may be formed to protect the structural features 133 from unintended consequences during subsequent processing in the fabrication sequence. For example, the cap 135 may protect the remaining portions 131 of the first oxide material 128 from removal or further thinning during performance of downstream wet or dry etching and/or cleaning processes, among other possible benefits.

The nitride material 134 used for the cap 135 may, in a number of embodiments, be the same as one or more of the insulation materials and/or other nitride materials described herein. For example, the nitride material 134 may be formed from Si$_3$N$_4$, although embodiments are not so limited. The nitride material 134 of the cap 135 may be formed (e.g., deposited) to a thickness in a range of from around 2 nm to around 10 nm.

Figure 1G:
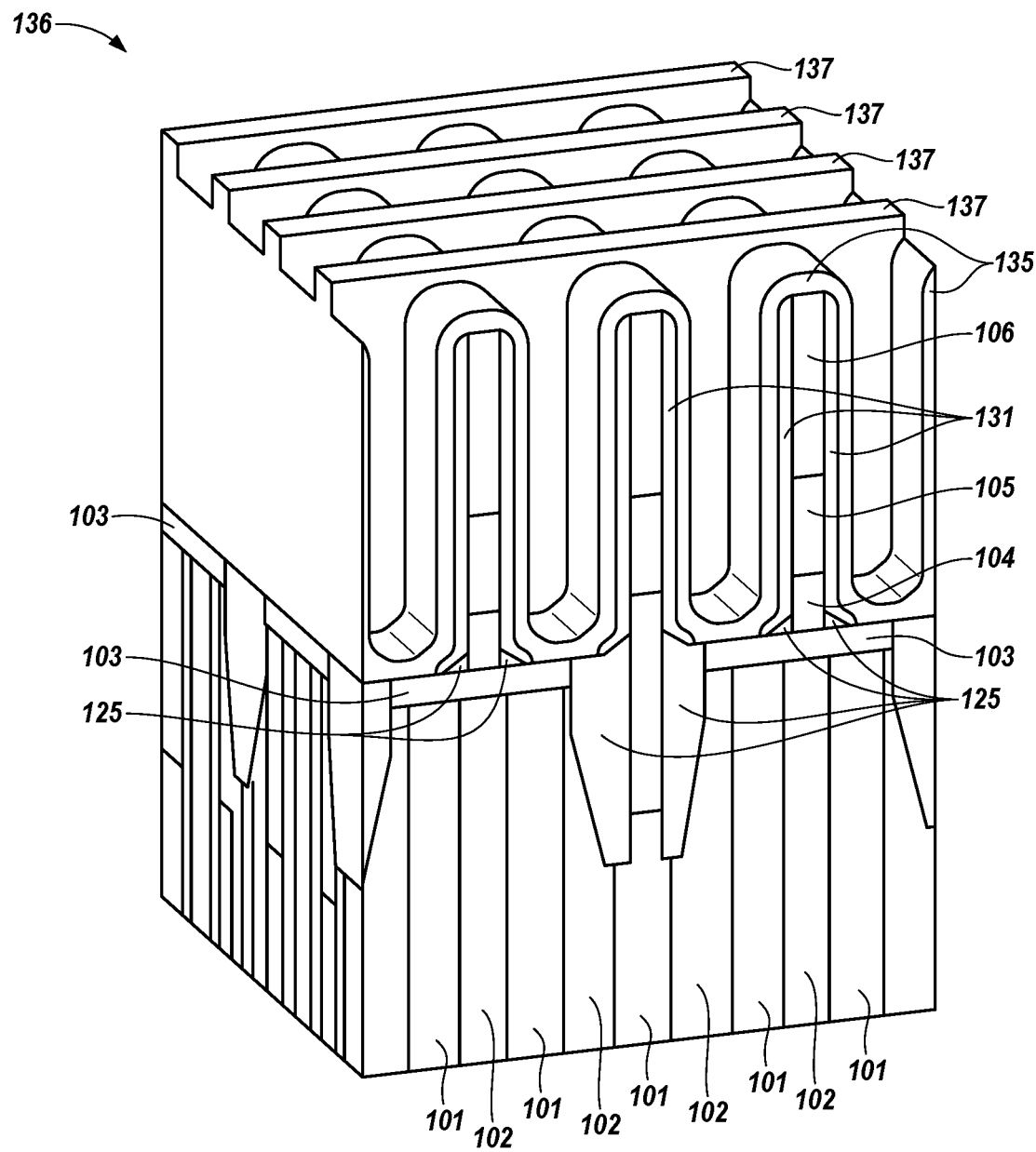

FIG. 1G illustrates a perspective view of example structural features 136 at a particular point in time after that shown in FIG. 1F in the example fabrication sequence in accordance with a number of embodiments of the present disclosure.

FIG. 1G shows the structural features 133 illustrated in FIG. 1F following formation (e.g., by a conformal wet or dry deposition process) of a nitride material 137 to enable subsequent formation of a plurality of rails (e.g., as shown at 141 and described in connection with FIG. 1H and elsewhere herein). The rails 141 shown in FIG. 1H and described herein may, for example, enable appropriate voltages to be carried to and from sense amplifiers for memory cells (e.g., of a DRAM memory array). The nitride material 137 shown in Figure G may be formed as a plurality of pillars that intersect substantially orthogonal to the nitride material 134 used for the cap 135, described in connection with FIG. 1F, over each of the sense line pillars 108.

The nitride material 137 used for the rails 141 may, in a number of embodiments, be the same or different from the nitride material 134 used for the cap 135 (e.g., one or more of the insulation materials described herein). For example, the nitride material 137 may be formed from Si$_3$N$_4$, although embodiments are not so limited. The nitride material 137 used for subsequent formation of the rails 141 may originally be deposited to a thickness in a range of from around 5 nm to around 20 nm. Deposition of the nitride material 137 may, in a number of embodiments, thicken the nitride material 134 previously formed on the first oxide material 128 on both sides of each sense line pillar 108, the working surface 103 in the spaces 111, and the nitride material 125 in the filled trenches 107.

Figure 1H:
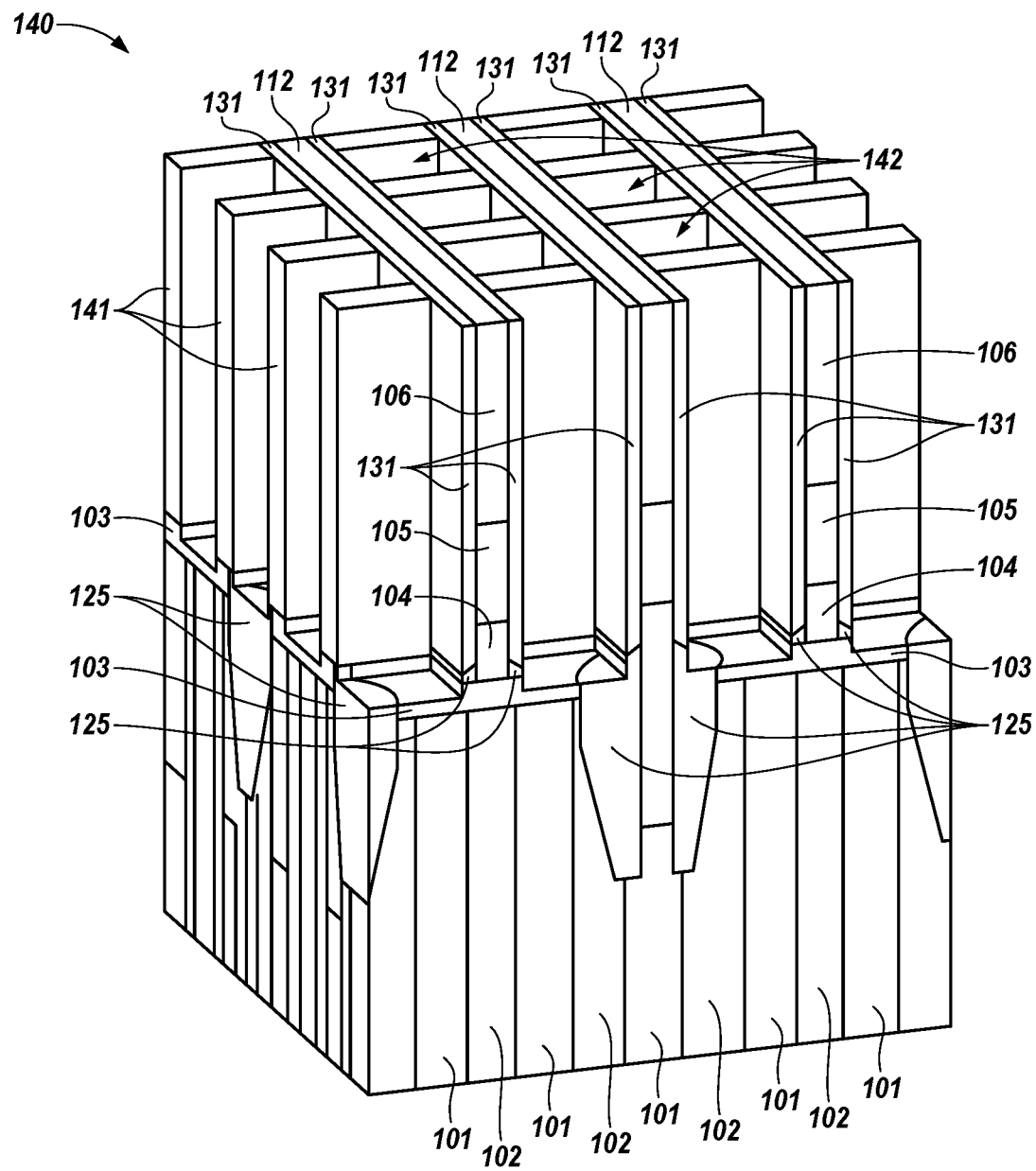

FIG. 1H illustrates a perspective view of example structural features 140 at a particular point in time after that shown in FIG. 1G in the example fabrication sequence in accordance with a number of embodiments of the present disclosure.

FIG. 1H shows the structural features 136 illustrated in FIG. 1G following removal (e.g., by performance of a conformal wet or dry etch process) of the nitride materials 134/137 that cover the first oxide material 128. The conformal etch process also may be performed to thin the rails 141, which intersect re-exposed first oxide material 131, to a particular thickness (e.g., in a range of from around 2 nm to around 10 nm). A remaining height of the rails 141 may correspond to a remaining height of the re-exposed first oxide material 131 and/or the insulation region 106 of each sense line pillar 108. Thinning the rails 141 to the particular thickness, by using the conformal etch process, also may be performed to form openings 142 of a particular cross-sectional area bordered by walls of the rails 141 and the re-exposed first oxide material 131 of each sense line pillar 108. The conformal etch process also may be performed to thin the working surface 103 at the bottom of the openings 142 bordered by the walls of the rails 141 and the re-exposed first oxide material 131.

Performance of the conformal etch process may, in a number of embodiments, result in thinning of the re-exposed first oxide material 131 relative to an original thickness of the first oxide material 128. Thinning of the re-exposed first oxide material 131 may be reduced by use of an etchant in the conformal etch process that is selective to the nitride material relative to the oxide material.

Figure 1I:
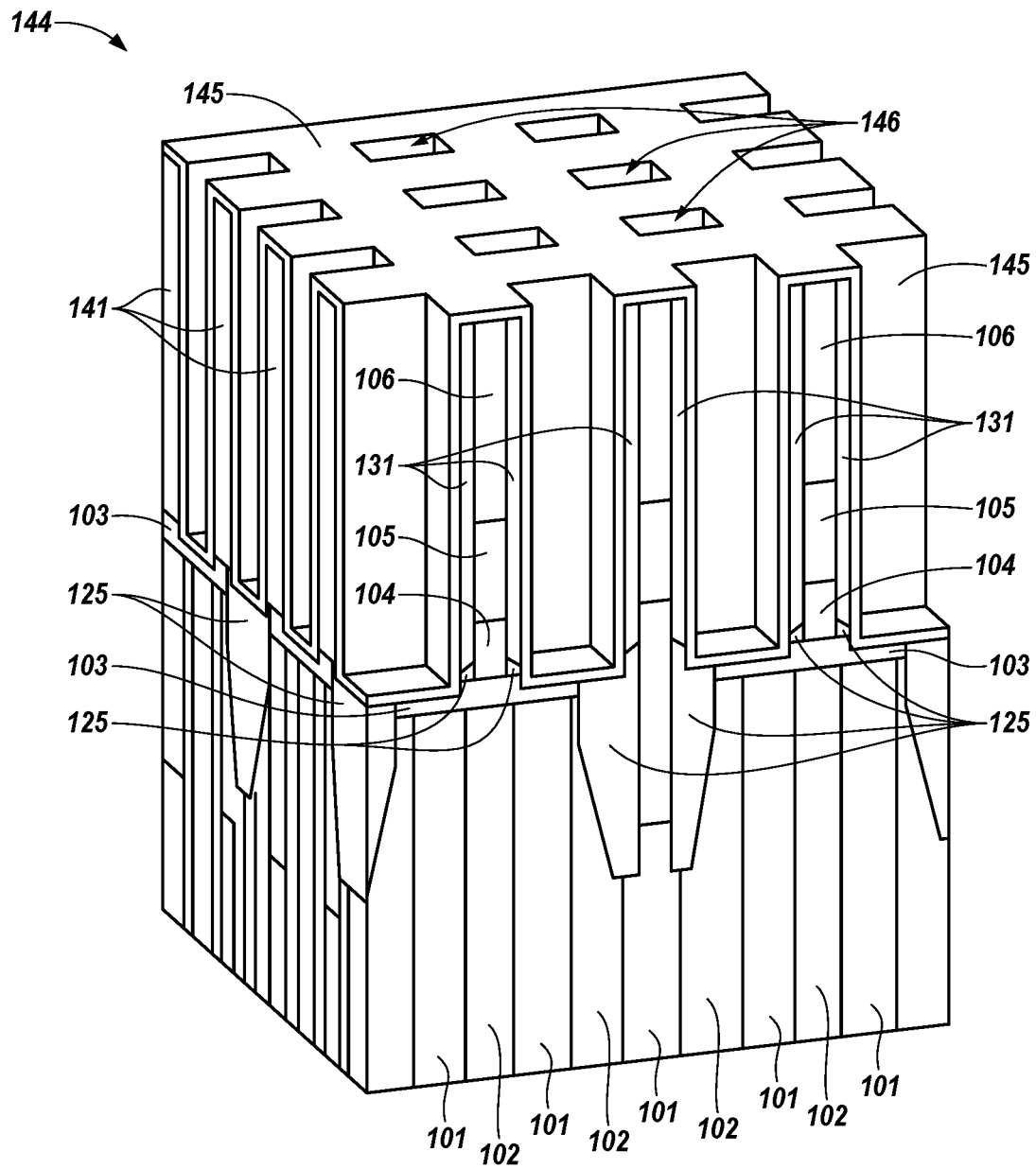

FIG. 1I illustrates a perspective view of example structural features 144 at a particular point in time after that shown in FIG. 1H in the example fabrication sequence in accordance with a number of embodiments of the present disclosure.

FIG. 1I shows the structural features 140 illustrated in FIG. 1H following formation (e.g., by a conformal dry deposition process) of a second oxide material 145 over the walls of the openings 142 bordered by walls of the rails 141 and the re-exposed first oxide material 131 of each sense line pillar 108. As such, remaining openings 146 may have a reduced cross-sectional area relative to the original openings 142.

The second oxide material 145 formed (e.g., deposited) over the walls of the rails 141 and the remaining first oxide material 131 of each sense line pillar 108 may, in a number of embodiments, be the same or different from the first oxide material 128. Hence, the second oxide material 145 may be formed from one or more of SiO, SiO$_2$, WO$_3$, and SiON, among other suitable oxide materials. The second oxide material 145 may be deposited by performance of a conformal dry deposition process. For example, the second oxide material 145 may be formed from $SiO_2$, although embodiments are not so limited.

The second oxide material 145 may be formed (e.g., deposited) to a thickness in a range of from around 2 nm to around 10 nm over (e.g., on) the walls of the rails 141 and the remaining first oxide material 131 of each sense line pillar 108. The second oxide material 145 also may be formed to a particular thickness over a top of the rails 141 and the sense line pillars 108 and/or over the remaining working substrate 103 at a bottom of the remaining openings 146.

Similar to the first oxide material 128, deposition of the second oxide material 145 may, in a number of embodiments, be performed under reducing conditions. Such reducing conditions may reduce (e.g., prevent) oxidation of the structural features 144 shown in FIG. 1I. Similar to the first oxide material 128, deposition of the second oxide material 145 as such may, in a number of embodiments, be performed in a same chamber 582 of the processing apparatus 581 as is used for performance of other portions of the fabrication sequence or deposition of the second oxide material 145 as such may be performed in a different chamber 582.

Figure 1J:
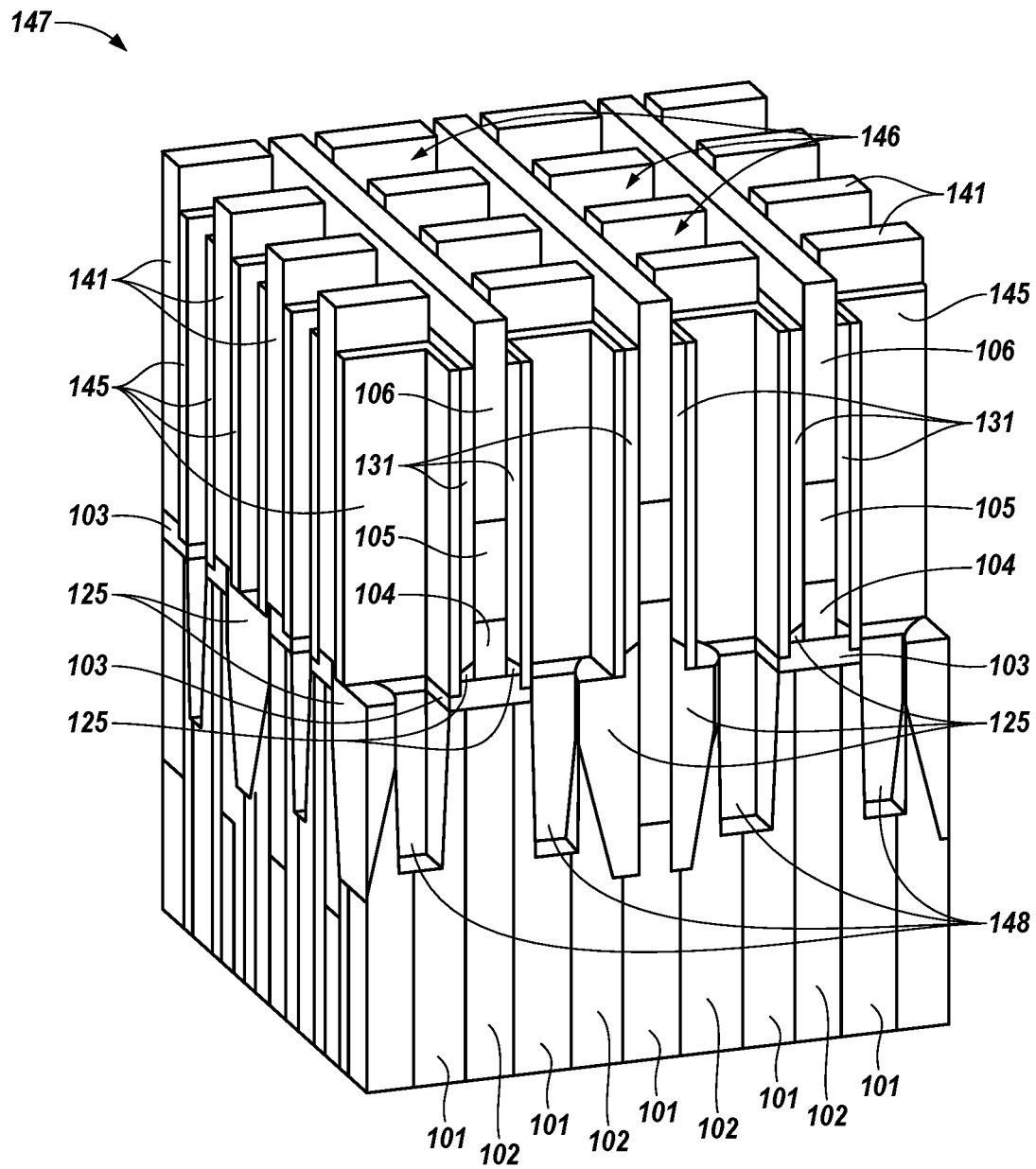

FIG. 1J illustrates a perspective view of example structural features 147 at a particular point in time after that shown in FIG. 1I in the example fabrication sequence in accordance with a number of embodiments of the present disclosure.

FIG. 1J shows the structural features 144 illustrated in FIG. 1I following removal (e.g., by a mostly directional and/or anisotropic dry etch process) of a portion of the second oxide material 145 from the walls of the remaining openings 146. The remaining openings 146 shown in FIG. 1J are bordered by walls formed from the rails 141 and by walls formed from the first oxide material 131 of each sense line pillar 108 having the second oxide material 145 formed thereon. The etch process may be performed to remove the second oxide material 145 from each side of the rails 141 and the insulation regions 106 of each sense line pillar 108 to a particular distance below the top of each in order to re-expose a top portion on each side of the rails 141 and the insulation regions 106.

The directional and/or anisotropic dry etch process also may be performed through (e.g., between) the top of the walls of the remaining openings 146 to etch through the working substrate 103 remaining at the bottom of the openings 146. The etch may be to a particular depth into silicon (e.g., the undoped silicon columns 101 and/or the oxide columns 102) below the working surface 103 at the bottom of the openings 146. The etch may be performed to create a deeper connection 148 for a storage node contact region (e.g., as shown at 151 and described in connection with FIG. 1K and elsewhere herein) below the working surface 103.

Performance of the directional and/or anisotropic dry etch process may result in removal (e.g., thinning) of the second oxide material 145 formed on each side (e.g., walls) of the rails 141 and the sense line pillars 108. The etching may be directionally controlled (e.g., aimed) such that any such removal is preferentially from the walls of the rails rather than the walls of the sense line pillars 108. As such, a total (e.g., combined) thickness of the second oxide material 145 and the re-exposed first oxide material 131 on the walls of the sense line pillars 108 may be in a range of from around 5 nm to around 15 nm. As such, the remaining openings 146 below the re-exposed top portion on each side of the rails 141 and the insulation regions 106 may, in a number of embodiments, have an increased cross-sectional area relative to the openings 146 shown and described in connection with FIG. 1I.

Figure 1K:
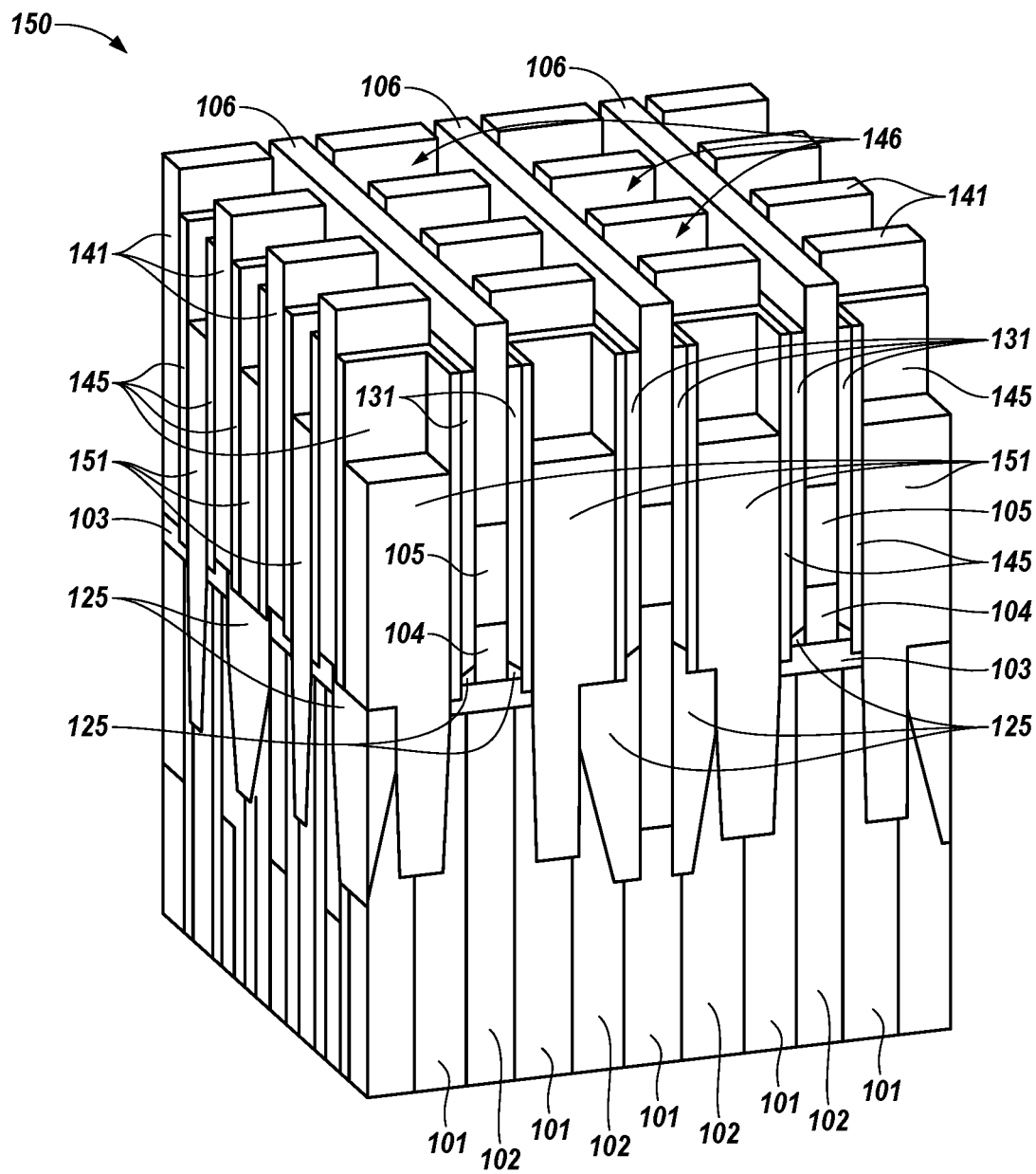

FIG. 1K illustrates a perspective view of example structural features 150 at a particular point in time after that shown in FIG. 1I in the example fabrication sequence in accordance with a number of embodiments of the present disclosure.

FIG. 1K shows the structural features 147 illustrated in FIG. 1J following formation (e.g., by a conformal dry deposition process) of a semiconductor material to fill the connections 148 under the working surface 103 and partially fill the remaining openings 146. The remaining openings 146 may be filled to a particular height below a top of remaining first oxide material 131 and second oxide material 145 on the walls of the sense line pillars 108 and a top of remaining second oxide material 145 on the walls of the rails 141.

Partially filling the remaining openings 146 to reach the particular height may be performed by, in a number of embodiments, filling the remaining openings 146 to the particular (e.g., intended) height with the semiconductor material (e.g., doped silicon). As a first alternative, reaching the particular height may be performed by filling the remaining openings 146 substantially to a level of a top surface of the second oxide material 145 followed by performance of an etch process (e.g., a conformal wet or dry etch process) to etch the semiconductor material back to the intended height below a top of the remaining first and second oxide materials 131, 145. As a second alternative, reaching the particular height may be performed by filling the remaining openings 146 substantially to, or above, a level of top surfaces of the insulation regions 106 of the sense line pillars 108 and/or the rails 141. In embodiments in which the semiconductor material is deposited to fill the remaining openings 146 to a level above the top surfaces of the insulation regions 106 and/or the rails 141, a CMP process may be performed to planarize the semiconductor material to the level of the top surfaces of the insulation regions 106 and/or the rails 141. Following performance of the CMP process, an etch process may be performed to etch the semiconductor material remaining in the openings 146 back to the intended height below the top of the remaining first and second oxide materials 131, 145 of an oxide only spacer 149.

The semiconductor material may be formed as a storage node contact region 151 used for selective contact (e.g., access, connection, etc.) of a sense line 105 to a storage node. Examples of storage nodes are shown at 262 and 762 and described in connection with FIG. 2 and FIG. 7, respectively. Selectivity of the contact between the sense line 105 and the storage node 262, 762 may be contributed to by an oxide only spacer (e.g., as shown at 149 and described in connection with FIG. 1L and elsewhere herein). The oxide only spacer 149 may be formed only from the first oxide material 128 and the second oxide material 145 on the walls of the sense line pillars 108 between, and in contact with, the sense lines 105 and the storage node contact regions 151.

The semiconductor for the storage node contact region 151 may, in a number of embodiments, include a doped silicon. The storage node contact regions 151 and the storage nodes 262, 762 described herein may be formed in an active region of a memory device. As described herein, an active region is intended to mean a region used to actively control access to, and use of, a storage node (e.g., including a capacitor) in read, write, erase, and/or refresh operations, among other possible operations.

Figure 1L:
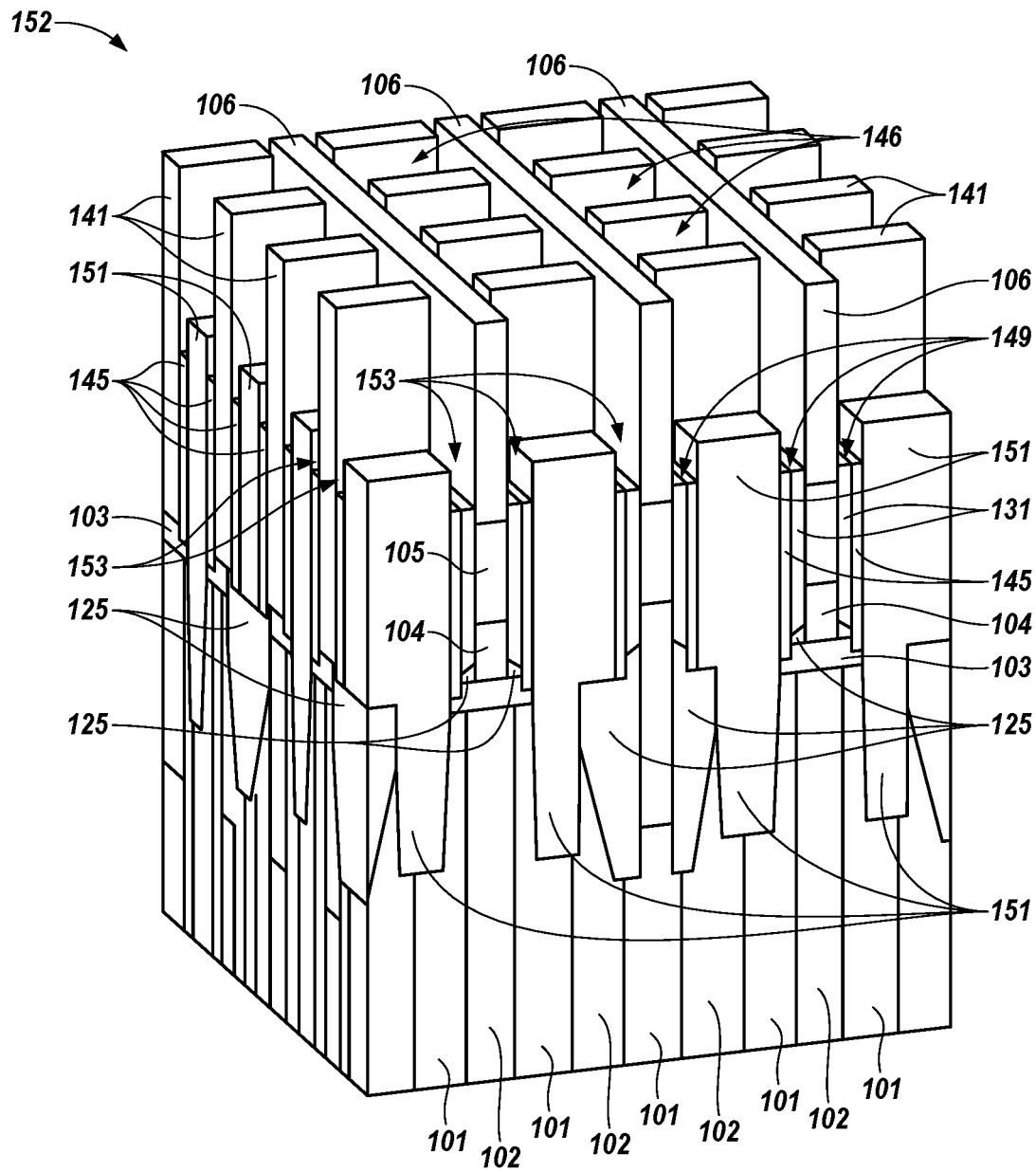

FIG. 1L illustrates a perspective view of example structural features 152 at a particular point in time after that shown in FIG. 1K in the example fabrication sequence in accordance with a number of embodiments of the present disclosure.

FIG. 1L shows the structural features 150 illustrated in FIG. 1K following removal (e.g., by a selective wet or dry etch process) of a portion of the remaining first oxide materials 131 and second oxide materials 145 to form the oxide only spacers 149. FIG. 1L shows that a height of the oxide only spacers 149 between the sense lines 105 and the storage node contact regions 151 may be reduced below a level of an upper surface of the storage node contact region 151. The height of the oxide only spacers 149 being reduced below the level of the upper surfaces of the storage node contact regions 151 may leave a gap 153 between sides of the storage node contact material 151 and the rails 141 and sense line pillars 108.

Figure 1M:
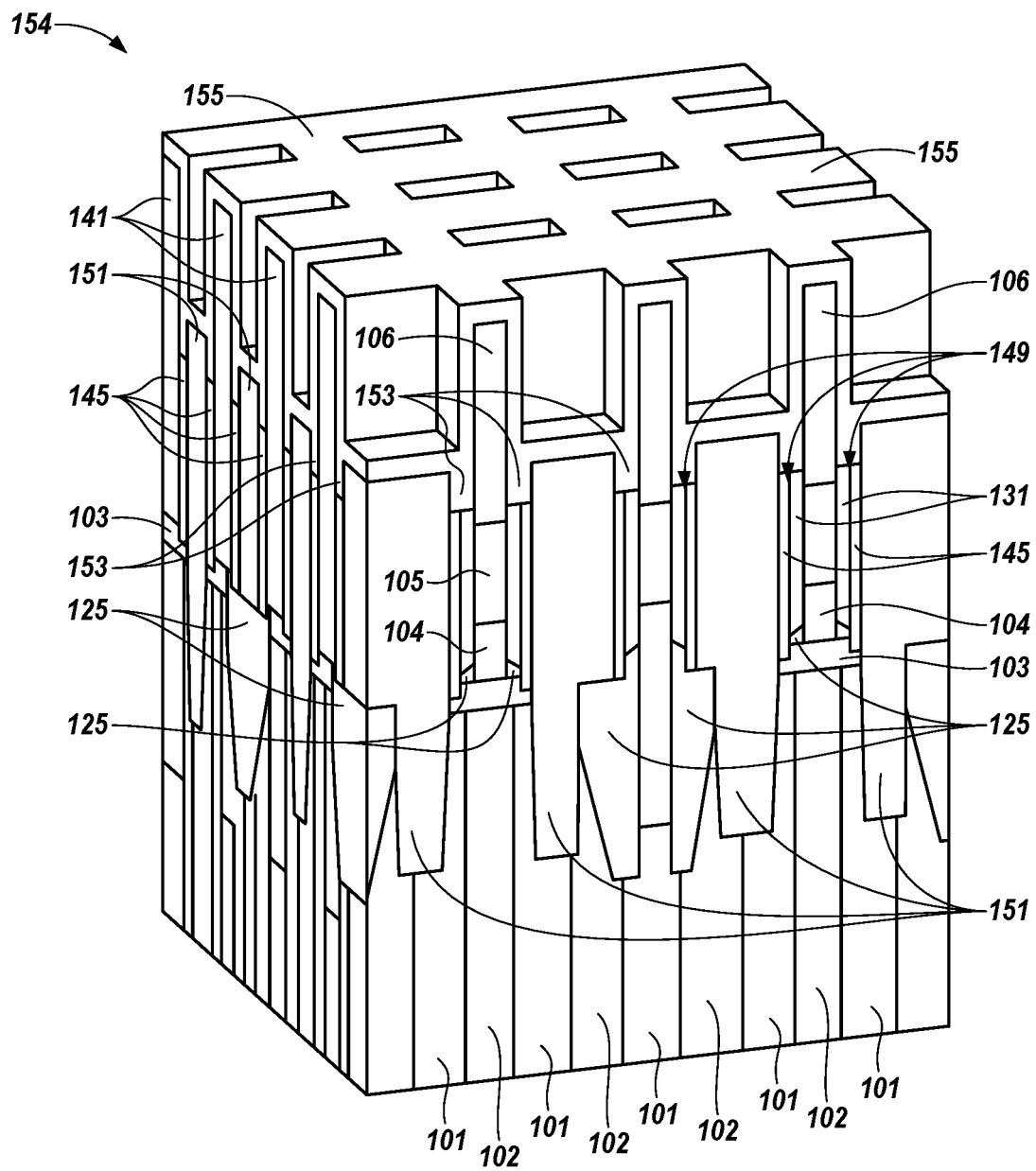

FIG. 1M illustrates a perspective view of example structural features 154 at a particular point in time after that shown in FIG. 1L in the example fabrication sequence in accordance with a number of embodiments of the present disclosure.

FIG. 1M shows the structural features 152 illustrated in FIG. 1L following formation (e.g., by a conformal wet or dry deposition process) of a nitride material 155 over such structural features 152. As such, the structural features in FIG. 1M show the nitride material 155 deposited in the remaining portions of the openings 146, including filling the gaps 153 between the sides of the storage node contact material 151 and the rails 141 and sense line pillars 108. The nitride material 155 also may be deposited to a particular height above the top of the rails 141 and sense line pillars 108. The nitride material 155 may be deposited to a thickness in a range of from around 2 nm to around 10 nm. The nitride material 155 may, in a number of embodiments, be the same as one or more of the insulation materials and/or other nitride materials described herein. For example, the nitride material 134 may be formed from $Si_3N_4$, although embodiments are not so limited.

Figure 1N:
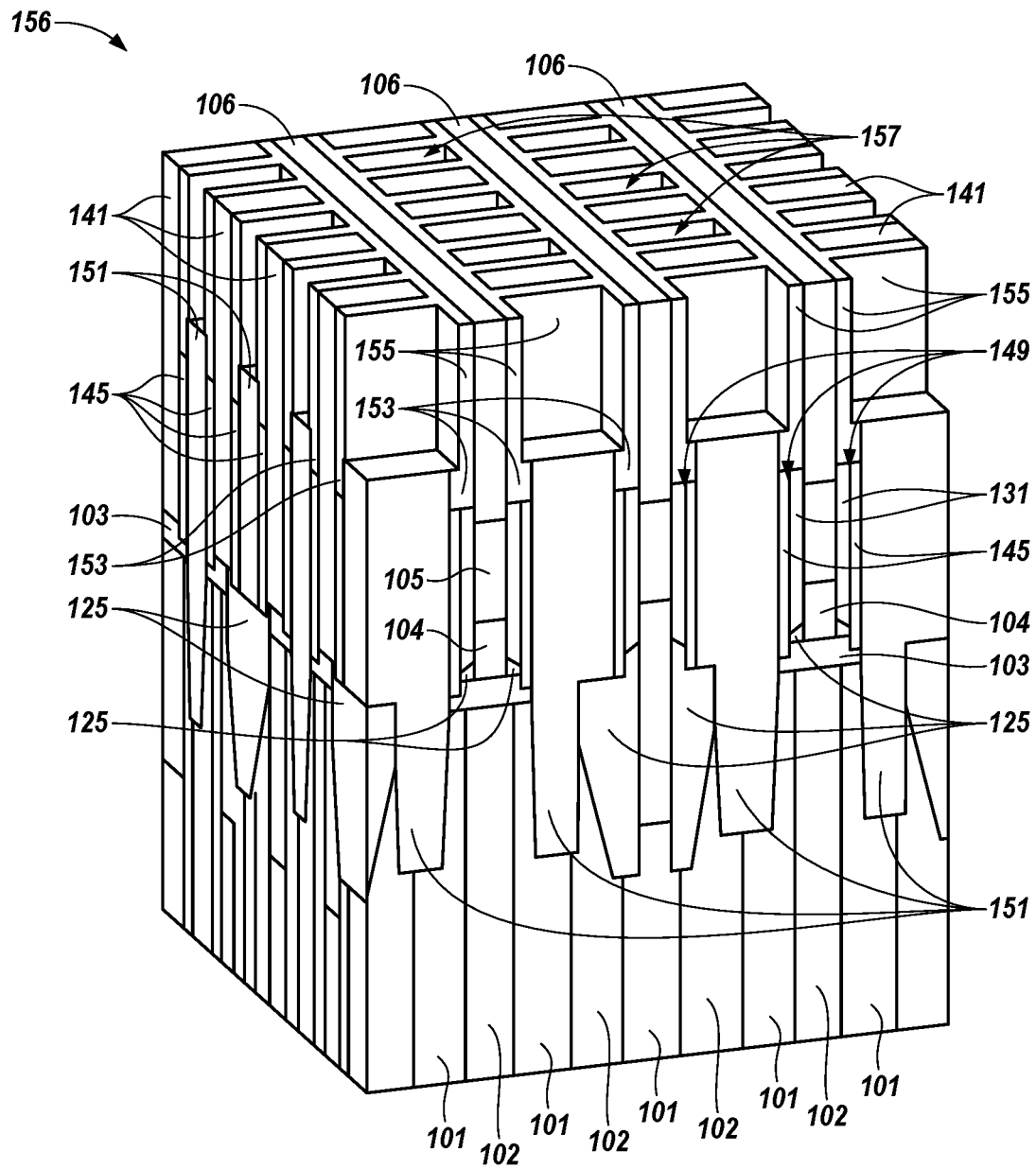
Figure 10:
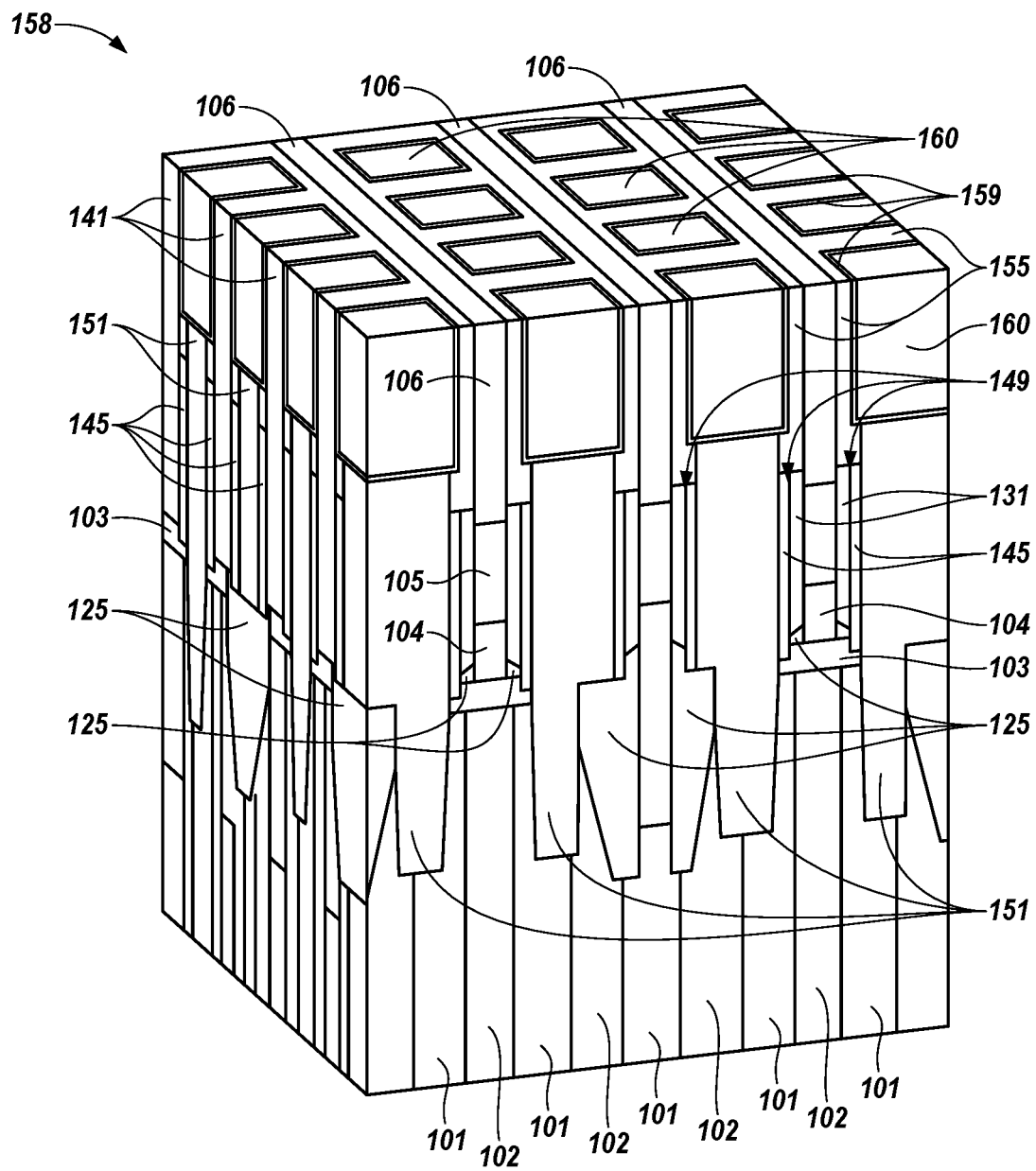

FIG. 1N illustrates a perspective view of example structural features 156 at a particular point in time after that shown in FIG. 1M in the example fabrication sequence in accordance with a number of embodiments of the present disclosure.

FIG. 1N shows the structural features 154 illustrated in FIG. 1M following removal (e.g., by a directional and/or anisotropic dry etch process) of a portion of the nitride material 155. FIG. 1N shows that removal of the portion of the nitride material 155 from bottoms of apertures 157 exposes a top of a storage node contact 151 formed from the storage node contact material in each of the apertures 157. The apertures 157 may have walls formed from the nitride material 155 on the rails 141 and the insulation regions 106 of the sense line pillars 108. The walls of the apertures 157 formed from the nitride material 155 may extend from above the reduced height of the oxide only spacers 149 to a top of the rail pillars 141 and a top of the sense line pillars 108.

FIG. 1O illustrates a perspective view of example structural features 158 at a particular point in time after that shown in FIG. 1N in the example fabrication sequence in accordance with a number of embodiments of the present disclosure.

FIG. 1O shows the structural features 156 illustrated in FIG. 1N following formation (e.g., by conformal wet or dry deposition processes) of a number of materials to fill the apertures 157 shown and described in connection with FIG. 1N. FIG. 1O shows that the structural features 158 may include a liner material 159 formed over (e.g., on) walls of the apertures 157 and an upper surface of the storage node contact 151. The liner material 159 may, for example, be a metallic and/or a nitride material, such as TiN and tantalum nitride (TaN), among other possibilities.

A conductive material 160 may be formed in the apertures 157 over the upper surface of the storage node contact 151 to enable conductive contact with a storage node 262, 762. The conductive material 160 may, in a number of embodiments, be formed either over the liner material 159 or over (e.g., directly on) the walls of the apertures 157 and the upper surface of the storage node contact 151. The conductive material 160 may include one or more of Fe, Co, Ti, Ni, Cu, Mo, W, Re, and Hg, among other suitable conductive materials. For example, the conductive material 160 may be, or include, a silicide material, such as $TiSi_x$ and/or $CoSi_x$, among other possibilities, which may form an ohmic contact with the liner material 159. The liner material 159 and/or the conductive material 160 may be formed adjacent to (e.g., in contact with) the tops of the rail pillars 141 and/or the sense line pillars 108.

Tests were performed on a number of combinations of oxide materials and/or nitride materials that were used for a spacer between a sense line (e.g., as shown at 105) and a storage node contact (e.g., as shown at 151). As determined by results of such tests, an oxide only spacer (e.g., as shown at 149 and described in connection with FIG. 1L and elsewhere herein) can reduce a sense line-to-storage node contact region capacitance relative to a spacer that includes a nitride material as described herein.

Using an oxide only spacer can reduce such capacitance relative to a nitride material of the spacer being in contact with at least one of the sense line and the storage node contact. For example, in a number of embodiments, one or more of such nitride materials (e.g., without any oxide material) may be formed as a spacer between, and in contact with, the sense line and the storage node contact. As one alternative, such a nitride material may be in contact with the sense line and an oxide material may be in contact with the storage node contact, or vice versa, or a nitride material may be in contact with both the sense line and the storage node contact with an oxide material sandwiched between the two nitride materials (e.g., in a NON spacer configuration). In addition, using an oxide only spacer can reduce such capacitance relative to a nitride material of the spacer being sandwiched between two oxide materials of the spacer that may be in contact with the sense line and the storage node contact (e.g., in an ONO spacer configuration).

In some embodiments, a particular oxide material used in the oxide only spacer that reduces the sense line-to-storage node contact region capacitance may have a lower dielectric constant (K) than a particular nitride material used in the spacer that includes the nitride material. For example, a K value of the oxide only spacer may be in a range of from around 3.0 to around 5.0, whereas a K value of a spacer including the nitride material may be in a range of from around 6.5 to around 9.0.

Figure 2:
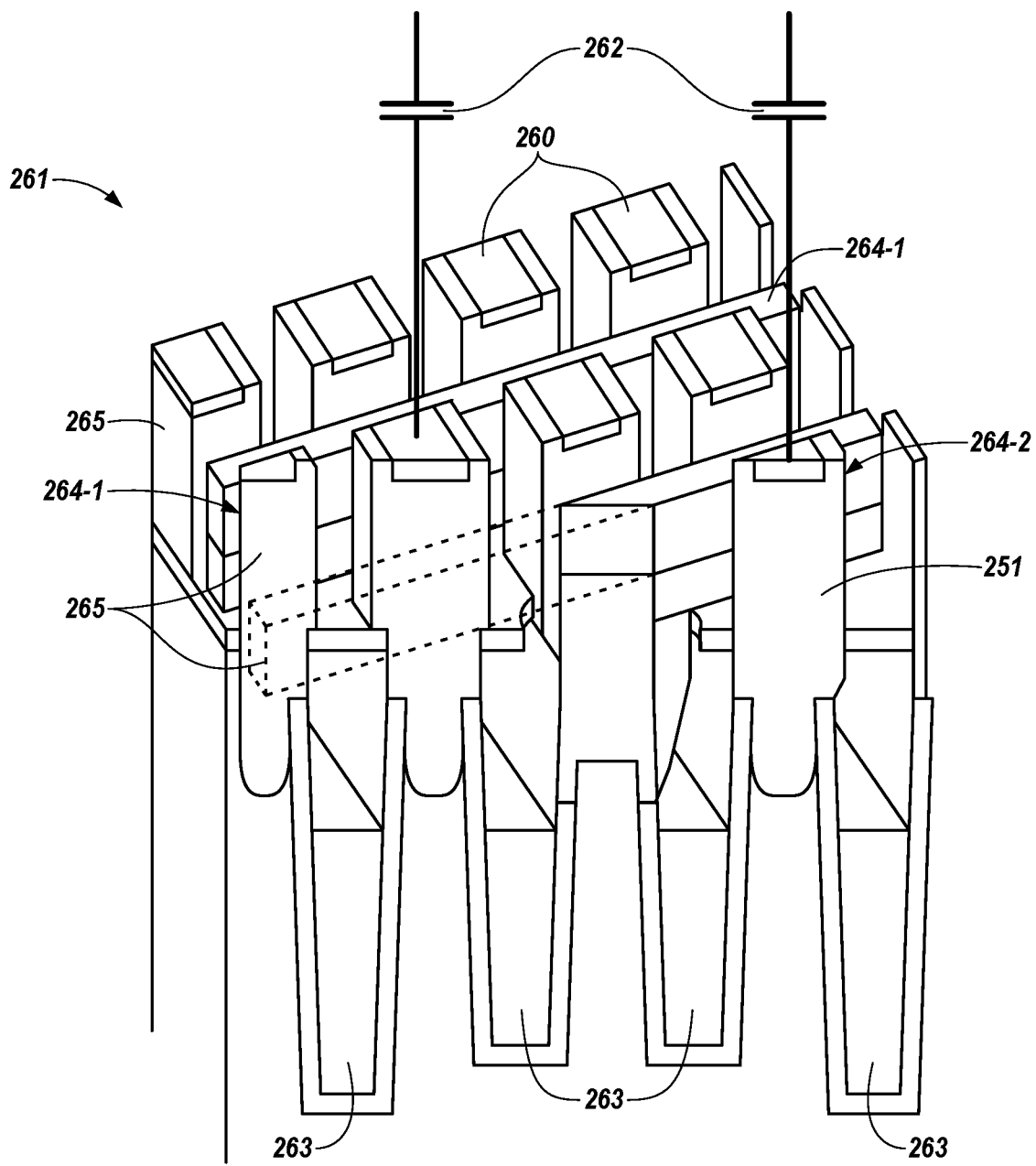
FIG. 2 illustrates a cross-section along a diagonal cut line of an example of a memory device that may be formed using the example fabrication sequence illustrated in FIGS. 1A-1O in accordance with a number of embodiments of the present disclosure.

FIG. 2 illustrates a cross-section along a diagonal cut line of an example of a memory device that may be formed using the example fabrication sequence illustrated in FIGS. 1A-1O in accordance with a number of embodiments of the present disclosure.

FIG. 2 illustrates a cross-sectional view of a portion of an example of semiconductor structures of a memory device 261 that may include storage nodes 262 (e.g., memory cell capacitors). Storage nodes 262 (e.g., in a row 265 of storage nodes) may be accessible through access lines 263. A sense line (not shown) may be used to sense data from storage nodes 262 positioned along the diagonal cut line 264-1 to 264-2 to connect (e.g., through an oxide only spacer 149 described herein) to a storage node contact region to sense data values stored in a plurality of the storage nodes 262. Sequences of the plurality of storage nodes 262 may each be associated with a different row 265 of the memory device 261. A storage node contact region, as described herein, may include the storage node contacts 251 and the conductive material 260 to contact (e.g., connect with) particular storage nodes 262 along the sense lines formed in accordance with a number of embodiments of the present disclosure.

The portion of the memory device 261 illustrated in FIG. 2 is shown by way of example and not by way of limitation to be consistent with a DRAM memory cell architecture. Another RAM, flash (e.g., NAND or NOR), and/or 3D memory cell architecture also may include sense lines and oxide only spacers, among other structural features, as described herein. Embodiments are not so limited. Although not shown in FIG. 2, the memory device 261 also may include recessed access devices (e.g., buried recessed access devices (BRADs) as shown and described in connection with FIG. 7).

Figure 3:
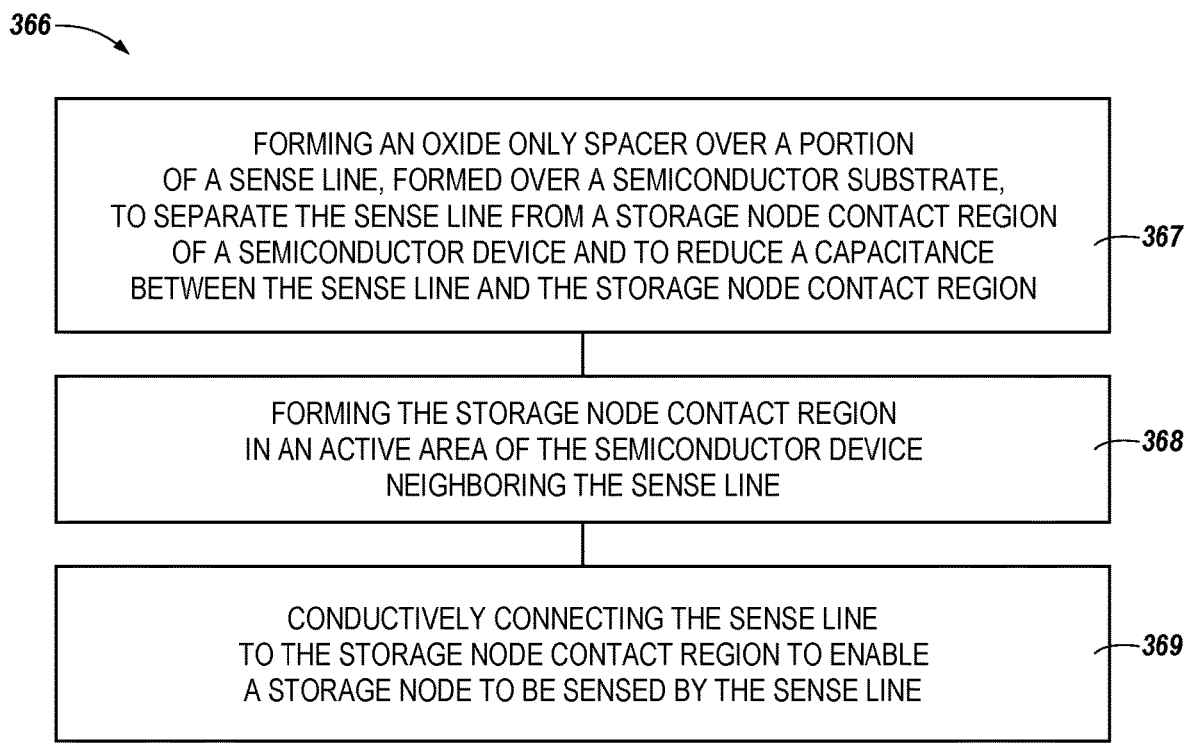
FIG. 3 is a flow diagram of an example method for capacitance reduction in a semiconductor device in accordance with a number of embodiments of the present disclosure.

FIG. 3 is a flow diagram of an example method 366 for capacitance reduction in a semiconductor device in accordance with a number of embodiments of the present disclosure. Unless explicitly stated, elements of methods described herein are not constrained to a particular order or sequence. Additionally, a number of the method embodiments, or elements thereof, described herein may be performed at the same, or at substantially the same, point in time.

At block 367, the method 366 may include forming an oxide only spacer over a portion of a sense line, formed over a semiconductor substrate, to separate the sense line from a storage node contact region of a semiconductor device and to reduce a capacitance between the sense line and the storage node contact region (e.g., as described with regard to the structural features and fabrication sequence in connection with FIGS. 1A-1O). At block 368, the method 366 may include forming the storage node contact region in an active area of the semiconductor device neighboring the sense line. At block 369, the method 366 may further include conductively connecting the sense line to the storage node contact region to enable a storage node to be sensed by the sense line.

The method 366 may, in a number of embodiments, further include conductively connecting the sense line to a recessed access device (e.g., a BRAD) in the active area of the semiconductor device (e.g., as shown and described in connection with FIG. 7). The method 366 may further include forming the semiconductor device in a DRAM array architecture.

The method 366 may further include forming, over a working surface of the semiconductor device, a plurality of rail pillars to intersect with a plurality of sense line pillars having a first oxide material deposited, as a first portion of the oxide only spacer, over surfaces of the plurality of sense line pillars (e.g., as shown and described in connection with FIGS. 1G and 1H). The method 366 may further include forming a plurality of openings within walls formed from the respective plurality of the rail pillars that intersect with the respective plurality of the sense line pillars (e.g., as shown and described with FIGS. 1G and 1H). The method 366 may further include depositing a second oxide material over the walls of the openings such that the second oxide material is deposited over the first portion as a second portion of the oxide only spacer (e.g., as shown and described in connection with FIGS. 1I and 1J). The method 366 may further include etching (e.g., by a conformal wet or dry etch process) the oxide only spacer to a particular thickness over the walls of the opening (e.g., as shown and described in connection with FIGS. 1J and 1K). The method 366 may further include etching the oxide only spacer to a particular distance below a top of an opening within the walls (e.g., as shown and described in connection with FIG. 1J). The method 366 may further include reducing, by the oxide only spacer formed from the first and second portions of the oxide materials, a capacitance of a sense line in a sense line pillar relative to a nitride material deposited as a spacer over a surface of the sense line pillar.

The method 366 may further include performing a dry or wet etch process, through a top of an opening within the walls, to a particular depth into silicon below a working surface at a bottom of the opening to create a deeper storage node contact. The dry etch process is described in connection with FIG. 1J concerning creation of the deeper connection 148 for the storage node contact 151 below the working surface 103. The method 366 may further include performing a dry clean process to remove residual oxide materials and residual silicon resulting from performance of a dry etch process. The dry etch process and/or the dry clean process may reduce a potential for unintended removal of the oxide materials of the oxide only spacer relative to use of a wet etch process or a wet clean process. The dry etch process and/or the dry clean process may, in a number of embodiments, be directional to further reduce the potential for unintended removal of the oxide materials. The dry etch and/or dry clean processes may be performed under reducing conditions (e.g., in a vacuum) to reduce (e.g., prevent) an increased resistance due to oxidation of a contact between the storage node contact 151 and the undoped silicon columns 101 and/or the oxide columns 102 under the working surface 103 relative to using a wet etch process.

The method 366 may further include depositing a doped silicon to form the storage node contact over the silicon (e.g., the undoped silicon columns 101) at the particular depth and over the oxide only spacer to a particular height in the opening (e.g., as shown and described in connection with FIG. 1K). The method 366 may further include reducing, by the oxide only spacer, a sense line-to-storage node contact capacitance relative to a spacer formed to include a nitride. The method 366 may further include filling the opening substantially to, or above, a level of a top surface of an insulation region of a sense line pillar, performing a CMP process to planarize the doped silicon to the level of the top surface of the insulation region. Following the CMP process, an etch process (e.g., a conformal wet or dry etch process) may be performed to etch the doped silicon remaining in the openings to the particular height below a top of the oxide only spacer.

The method 366 may further include epitaxially growing a doped silicon to form the storage node contact over the silicon at the particular depth and over the oxide only spacer to a particular height in the opening (e.g., as shown in connection with FIG. 1K). The method 366 may further include reducing, by the oxide only spacer, a sense line-to-storage node contact capacitance relative to a spacer formed to include a nitride and reducing, by the storage node contact being grown epitaxially, a contact resistance between the doped silicon and the silicon. The dry etch and dry clean processes (e.g., under vacuum and/or reducing conditions)

and an epitaxial growth process may, in a number of embodiments, be performed in a same chamber 582 of the processing apparatus 581 as is used for performance of other portions of the fabrication sequence or one or more of the dry etch, dry clean, or epitaxial growth processes may be performed in a number of different chambers 582.

For example, when one or more semiconductor wafers 584 are moved (e.g., transferred) from a first chamber 582 to a second chamber, the wafers 584 may be transferred without effect on (e.g., an end to or reduction of) the vacuum and/or reducing conditions relative to a level of such conditions in the first chamber. In a number of embodiments, the semiconductor wafers 584 (e.g., the semiconductor devices including the oxide only spacers 149 described herein) may be maintained under vacuum and/or reducing conditions in one or more chambers 582 at each, or a defined subset, of the points in the fabrication sequences. For example, the semiconductor devices may be maintained under vacuum through completion of performance of an etch process, a clean process, and/or an epitaxial growth process. The semiconductor devices also may be maintained under vacuum through processes performed following a last etch, a last clean, and/or a last epitaxial growth process, including during processes performed on the semiconductor devices by, or including, movement (e.g., transfer) to a different chamber 582 of the processing apparatus 581 or elsewhere (e.g., to a different apparatus for performance of additional portions of the fabrication sequence).

Figure 5:
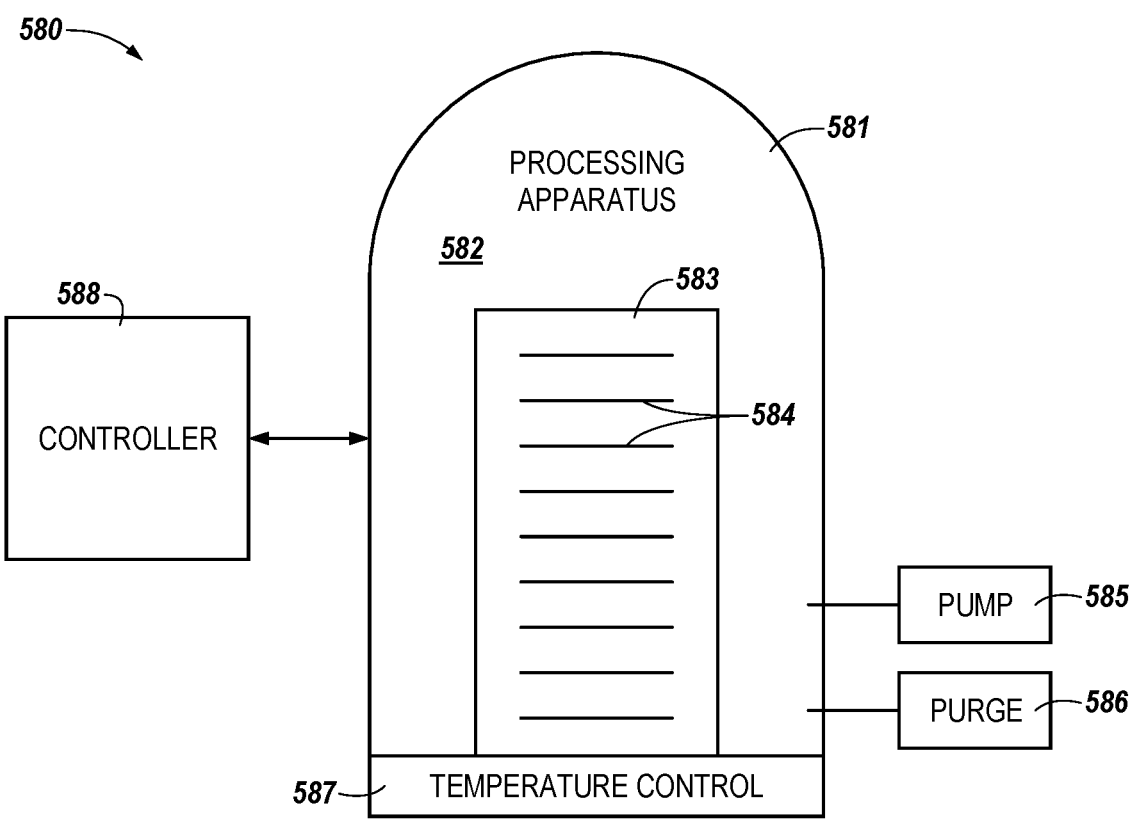
FIG. 5 is a functional block diagram of a system for implementation of an example semiconductor fabrication process in accordance with a number of embodiments of the present disclosure.

As used herein, a "vacuum" is intended to mean a region (e.g., a chamber 582 of a processing apparatus 581 illustrated in FIG. 5) having a gaseous pressure that is notably less than ambient atmospheric pressure (e.g., outside the chamber). As such, a vacuum in a chamber may have gaseous pressure in a range of from a substantially perfect vacuum to a partial vacuum having a gaseous pressure (e.g., as measured in pascal units) no greater than a particular pressure that is lower than the ambient pressure. The particular pressure of the partial vacuum may be a gaseous pressure (e.g., of a single gas or a mixture of gases) that has been determined to be suitable for performance of at least one of the particular activities in the fabrication sequence. Various activities in the fabrication sequence may be performed under reducing conditions (e.g., in the presence of a high concentration of hydrogen, nitrogen, and/or an inert gas relative to oxygen, among other possible gases) that may reduce (e.g., prevent) oxidation of structural features, such as those described in connection with FIG. 1D and elsewhere herein. In a number of embodiments, various activities in the fabrication sequence may be performed under reducing conditions and in a partial vacuum, as has been determined to be suitable for performance of each of the various activities.

Figure 4:
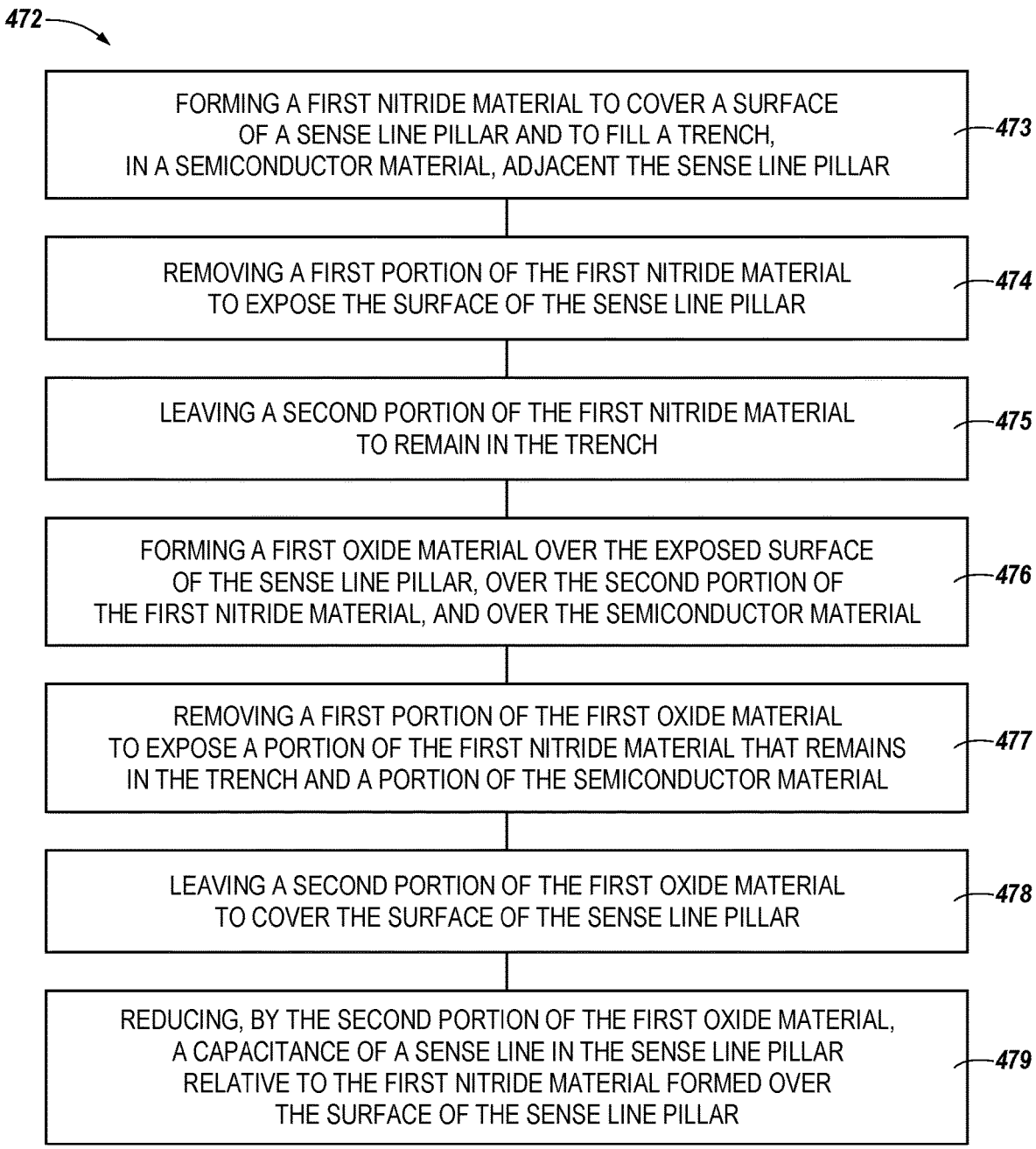
FIG. 4 is a flow diagram of another example method for capacitance reduction in a semiconductor device in accordance with a number of embodiments of the present disclosure.

FIG. 4 is a flow diagram of another example method 472 for capacitance reduction in a semiconductor device in accordance with a number of embodiments of the present disclosure.

At block 473, the method 472 may include forming a first nitride material to cover a surface of a sense line pillar and to fill a trench, in a semiconductor material, adjacent the sense line pillar (e.g., as shown and described in connection with FIG. 1B). At block 474, the method 472 may include removing a first portion of the first nitride material to expose the surface of the sense line pillar (e.g., as shown and described in connection with FIG. 1C). At block 475, the method 472 may include leaving a second portion of the first nitride material to remain in the trench (e.g., as also shown and described in connection with FIG. 1C).

At block 476, the method 472 may include forming a first oxide material over the exposed surface of the sense line pillar, over the second portion of the first nitride material, and over the semiconductor material (e.g., as shown and described in connection with FIG. 1D). At block 477, the method 472 may include removing a first portion of the first oxide material to expose a portion of the first nitride material that remains in the trench and a portion of the semiconductor material (e.g., as shown and described in connection with FIG. 1E). At block 478, the method 472 may include leaving a second portion of the first oxide material to cover the surface of the sense line pillar (e.g., as also shown and described in connection with FIG. 1E). At block 479, the method 472 may include reducing, by the second portion of the first oxide material, a capacitance of a sense line in the sense line pillar (e.g., in addition to contributing to reduction of the sense line-to-storage node contact capacitance described herein) relative to the first nitride material formed over the surface of the sense line pillar.

The method 472 may further include forming a second nitride material as a cap over the second portion of the first oxide material that covers the surface of the sense line pillar (e.g., as shown and described in connection with FIG. 1F). The method 472 may further include protecting, by the cap, the second portion of the first oxide material from unintended consequences during subsequent processing to form a semiconductor device.

The method 472 may further include forming a plurality of rail pillars to intersect with a respective plurality of sense line pillars (e.g., as shown and described in connection with FIGS. 1G and 1H). The respective plurality of sense line pillars may have the second portion of the first oxide material deposited over both surfaces thereof. The method 472 may further include forming a plurality of openings having a first cross-sectional area within walls formed from the plurality of the sense line pillars, having the second portion of the first oxide material formed thereon, and from the respective plurality of the rail pillars (e.g., as also shown and described in connection with FIGS. 1G and 1H).

The method 472 may further include forming a second oxide material over the walls of the openings (e.g., as shown and described in connection with FIG. 1I). The method 472 may further include forming the second oxide material over the walls of the openings to increase a total thickness, formed on surfaces of the sense line pillars, of the first and second oxide materials and decrease the first cross-sectional area to a second cross-sectional area (e.g., as shown and described in connection with FIG. 1J).

The method 472 may further include forming a storage node contact material over the second oxide material to fill an opening within the walls to a particular level (e.g., as shown and described in connection with FIG. 1K). The method 472 may further include reducing a height of the second oxide material formed over the rail pillars and a height of both the first oxide material and the second oxide material formed over the sense line pillars to be below the particular level of the storage node contact material (e.g., as shown and described in connection with FIG. 1L). The method 472 may further include forming a second nitride material in the opening to fill a gap between sides of the storage node contact material and the rail and sense line pillars created by reducing the height of the oxide materials (e.g., as shown and described in connection with FIG. 1M).

The method 472 may further include leaving a remainder of the heights of both the first oxide material and the second oxide material as an oxide only spacer between, and in contact with, the sense line and the storage node contact material (e.g., as shown and described in connection with FIGS. 1L and 1M). The method 472 may further include reducing, by the remainder of the height of the oxide only spacer, a sense line-to-storage node contact capacitance relative to a spacer formed to include a nitride.

The method 472 may further include uncovering surfaces of the rail pillars and the sense line pillars, above the reduced height of the oxide only spacer, by the reduction of the height of the oxide materials to below the particular level of the storage node contact material (e.g., as shown and described in connection with FIG. 1L). The method 472 may further include forming the second nitride material over the uncovered surfaces of the rail pillars and the sense line pillars above the reduced height of the oxide only spacer such that a bottom of an aperture, having walls formed from the second nitride material, exposes a top of a storage node contact formed from the storage node contact material (e.g., as shown and described in connection with FIG. 1N). The method 472 may further include forming the aperture to have the walls, formed from the second nitride material, extend from above the reduced height of the oxide only spacer to a top of the rail pillars and the sense line pillars (e.g., as also shown and described in connection with FIG. 1N). The method 472 may further include forming a conductive material in the aperture, over the top of the storage node contact, to enable conductive contact with a storage node (e.g., as also shown and described in connection with FIG. 1O).

FIG. 5 is a functional block diagram of a system 580 for implementation of an example semiconductor fabrication process in accordance with a number of embodiments of the present disclosure. The system 580 may include a processing apparatus 581. The processing apparatus 581 may be configured to enable formation of structural materials on and/or removal of structural materials from a semiconductor device during fabrication of the semiconductor device.

The processing apparatus 581 may include a chamber 582 to enclose components configured to perform wet or dry deposition or etch operations, possibly in addition to other operations (e.g., epitaxial growth operations, among others), on a number of semiconductor devices (e.g., wafers on which memory devices 261, 698, 763 or arrays 695 are being formed by the example semiconductor fabrication sequences described herein). The chamber 582 may further enclose a carrier 583 to hold a batch of semiconductor wafers 584. The processing apparatus 581 may include and/or be associated with tools including, for example, a pump 585 unit and a purge 586 unit configured to introduce and remove appropriate deposition chemistries and etch chemistries, or tools for performance of an epitaxial growth process, as described herein, at each point in the semiconductor fabrication sequence. The processing apparatus 581 may further include a temperature control 587 unit configured to maintain the chamber 582 at an appropriate temperature at each of the points in the fabrication sequences. For example, the temperature control 587 unit may be configured to bring the chamber 582 to a raised temperature appropriate for performance of some processes and to reduce the temperature as appropriate for performance of other process (e.g., dry or wet deposition, etching, epitaxial growth, etc.). The system 580 may include a number of chambers 582 that are each configured to perform particular processes (e.g., a wet etch process, a dry etch process, a wet deposition process, a dry deposition process, a wet clean process, a dry clean process, an epitaxial growth process, among others) during the fabrication sequence.

The system 580 may further include a controller 588. The controller 588 may include, or be associated with, circuitry and/or programming for implementation of, for instance, formation and removal of materials, including deposition, etching, and/or epitaxial growth of various materials, related to capacitance reduction in a semiconductor device. Adjustment of such deposition, etching, and epitaxial growth operations by the controller 588 may control the CDs of the semiconductor devices created in the processing apparatus 581.

A host may be configured to generate instructions related to capacitance reduction in a semiconductor device. An example of a host is shown at 690 in FIG. 6, although embodiments are not limited to being coupled to the memory system 689 shown in FIG. 6. The instructions may be sent via a host interface 691 to the controller 588 of the processing apparatus 581. The instructions may be based at least in part on scaled preferences (e.g., in numerically and/or structurally defined gradients) stored by the host 690, provided via input from another storage system (not shown), and/or provided via input from a user (e.g., a human operator), among other possibilities. The controller 588 may be configured to enable input of the instructions and scaled preferences to define the CDs of the fabrication of the semiconductor device to be implemented by the processing apparatus 581.

The scaled preferences may determine final structures (e.g., the CDs) of the structural materials, conductive materials, insulating materials, oxide materials, nitride materials, semiconductor materials, substrate materials, dielectric materials, capacitor materials, memory devices, and/or memory cells, among the various other structural features described herein. Particular CDs may be enabled by the particular scaled preferences that are input via the instructions. Receipt and implementation of the scaled preferences by the controller 588 may result in corresponding adjustment, by the processing apparatus 581, of a deposition time for various materials, adjustment of a coverage area, height, and/or volume of the various materials, adjustment of a trim direction and/or trim time performed on the various materials, adjustment of an etch direction, adjustment of an etch time performed on the various materials, and/or adjustment of the temperature during the various processes, among implementation of other possible scaled preferences.

The controller 588 may, in a number of embodiments, be configured to use hardware as control circuitry. Such control circuitry may, for example, be an application specific integrated circuit (ASIC) with logic to control fabrication steps, via associated deposition, etch, and/or epitaxial growth processes, related to capacitance reduction in a semiconductor device, along with formation of the various materials on and removal of the various materials from the semiconductor device.

The controller 588 may be configured to receive the instructions and direct performance of operations, corresponding to the instructions, by the processing apparatus 581. The controller 588 may be configured to implement the instructions to control a quantity of the various materials that are formed on and removed from the semiconductor device.

Figure 6:
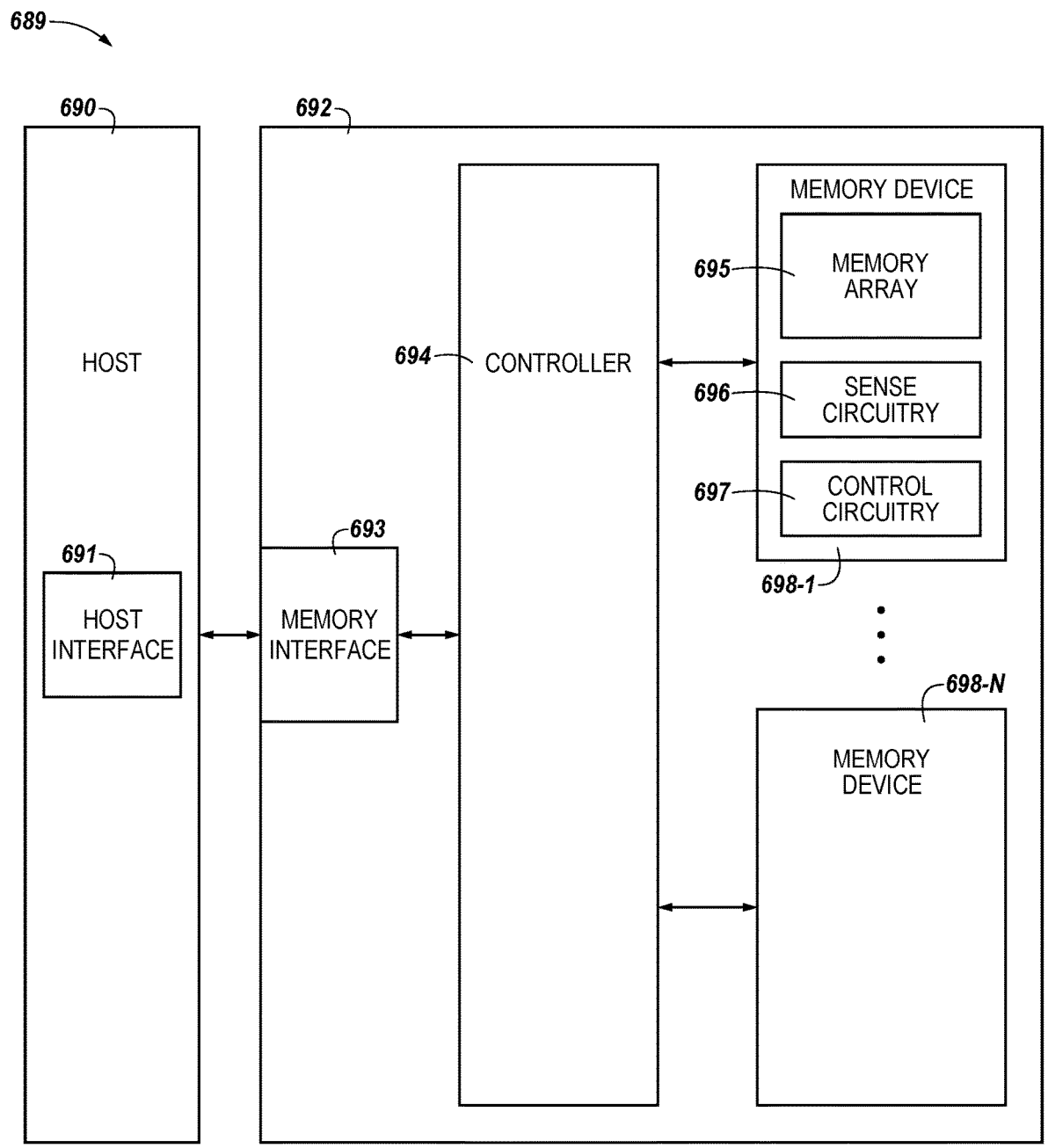
FIG. 6 is a functional block diagram of a computing system including at least one memory system in accordance with one or more embodiments of the present disclosure.

FIG. 6 is a functional block diagram of a computing system 689 including at least one memory system 692 in accordance with one or more embodiments of the present disclosure. Memory system 692 may be, for example, a solid-state drive (SSD).

In the embodiment illustrated in FIG. 6, memory system 692 includes a memory interface 693, a number of memory devices 698-1, . . . , 698-N, and a controller 694 selectably coupled to the memory interface 693 and memory devices 698-1, . . . , 698-N. Memory interface 693 may be used to communicate information between memory system 692 and another device, such as a host 690. Host 690 may include a processor (not shown). As used herein, "a processor" may be a number of processors, such as a parallel processing system, a number of coprocessors, etc. Example hosts may include, or by implemented in, laptop computers, personal computers, digital cameras, digital recording devices and playback devices, mobile telephones, PDAs, memory card readers, interface hubs, and the like. Such a host 690 may be associated with fabrication operations performed on semiconductor devices and/or SSDs using, for example, a processing apparatus.

In a number of embodiments, host 690 may be associated with (e.g., include or be coupled to) a host interface 691. The host interface 691 may enable input of scaled preferences (e.g., in numerically and/or structurally defined gradients) to define, for example, critical dimensions (CDs) of a final structure or intermediary structures of a memory device (e.g., as shown at 261, 698, and/or 763) and/or an array of memory cells (e.g., as shown at 695) formed thereon. The scaled preferences may be provided to the host interface 691 via input of a number of preferences stored by the host 690, input of preferences from another storage system (not shown), and/or input of preferences by a user (e.g., a human operator).

Memory interface 693 may be in the form of a standardized physical interface. For example, when memory system 692 is used for information (e.g., data) storage in computing system 689, memory interface 693 may be a serial advanced technology attachment (SATA) interface, a peripheral component interconnect express (PCIe) interface, or a universal serial bus (USB) interface, among other physical connectors and/or interfaces. In general, however, memory interface 693 may provide an interface for passing control, address, information, scaled preferences, and/or other signals between the controller 694 of memory system 692 and a host 690 (e.g., via host interface 691).

Controller 694 may include, for example, firmware and/or control circuitry (e.g., hardware). Controller 694 may be operably coupled to and/or included on the same physical device (e.g., a die) as one or more of the memory devices 698-1, . . . , 698-N. For example, controller 694 may be, or may include, an ASIC as hardware operably coupled to circuitry (e.g., a printed circuit board) including memory interface 693 and memory devices 698-1, . . . , 698-N. Alternatively, controller 694 may be included on a separate physical device that is communicatively coupled to the physical device (e.g., the die) that includes one or more of the memory devices 698-1, . . . , 698-N.

Controller 694 may communicate with memory devices 698-1, . . . , 698-N to direct operations to sense (e.g., read), program (e.g., write), and/or erase information, among other functions and/or operations for management of memory cells. Controller 694 may have circuitry that may include a number of integrated circuits and/or discrete components. In a number of embodiments, the circuitry in controller 694 may include control circuitry for controlling access across memory devices 698-1, . . . , 698-N and/or circuitry for providing a translation layer between host 690 and memory system 692.

Memory devices 698-1, . . . , 698-N may include, for example, a number of memory arrays 695 (e.g., arrays of volatile and/or non-volatile memory cells). For instance, memory devices 698-1, . . . , 698-N may include arrays of memory cells, such as a portion of an example memory device 261, 698, 763 structured to include access lines, sense lines, and electrodes described in connection with FIGS. 2, 6, and 7, respectively. As will be appreciated, the memory cells in the memory arrays 695 of memory devices 698-1, . . . , 698-N may be in a RAM architecture (e.g., DRAM, SRAM, SDRAM, FeRAM, MRAM, ReRAM, etc.), a flash architecture (e.g., NAND, NOR, etc.), a three-dimensional (3D) RAM and/or flash memory cell architecture, or some other memory array architecture including pillars and adjacent trenches.

Memory devices 261, 698, 763 may be formed on the same die. A memory device (e.g., memory device 698-1) may include one or more arrays 695 of memory cells formed on the die. A memory device may include sense circuitry 696 and control circuitry 697 associated with one or more arrays 695 formed on the die, or portions thereof. The sense circuitry 696 may be utilized to determine (sense) a particular data value (e.g., 0 or 1) that is stored at a particular storage node 262, 762 (e.g., memory cell) in a row of an array 695. The control circuitry 697 may be utilized to direct the sense circuitry 696 to sense particular data values, in addition to directing storage, erasure, etc., of data values in response to a command from host 690 and/or host interface 691. The command may be sent directly to the control circuitry 697 via the memory interface 693 or to the control circuitry 697 via the controller 694.

The embodiment illustrated in FIG. 6 may include additional circuitry that is not illustrated so as not to obscure embodiments of the present disclosure. For example, memory devices 261, 698, 763 may include address circuitry to latch address signals provided over I/O connectors through I/O circuitry. Address signals may be received and decoded by a row decoder and a column decoder to access a memory array 695. It will be appreciated that the number of address input connectors may depend on the density and/or architecture of memory devices 261, 698, 763 and/or memory arrays 695.

Figure 7:
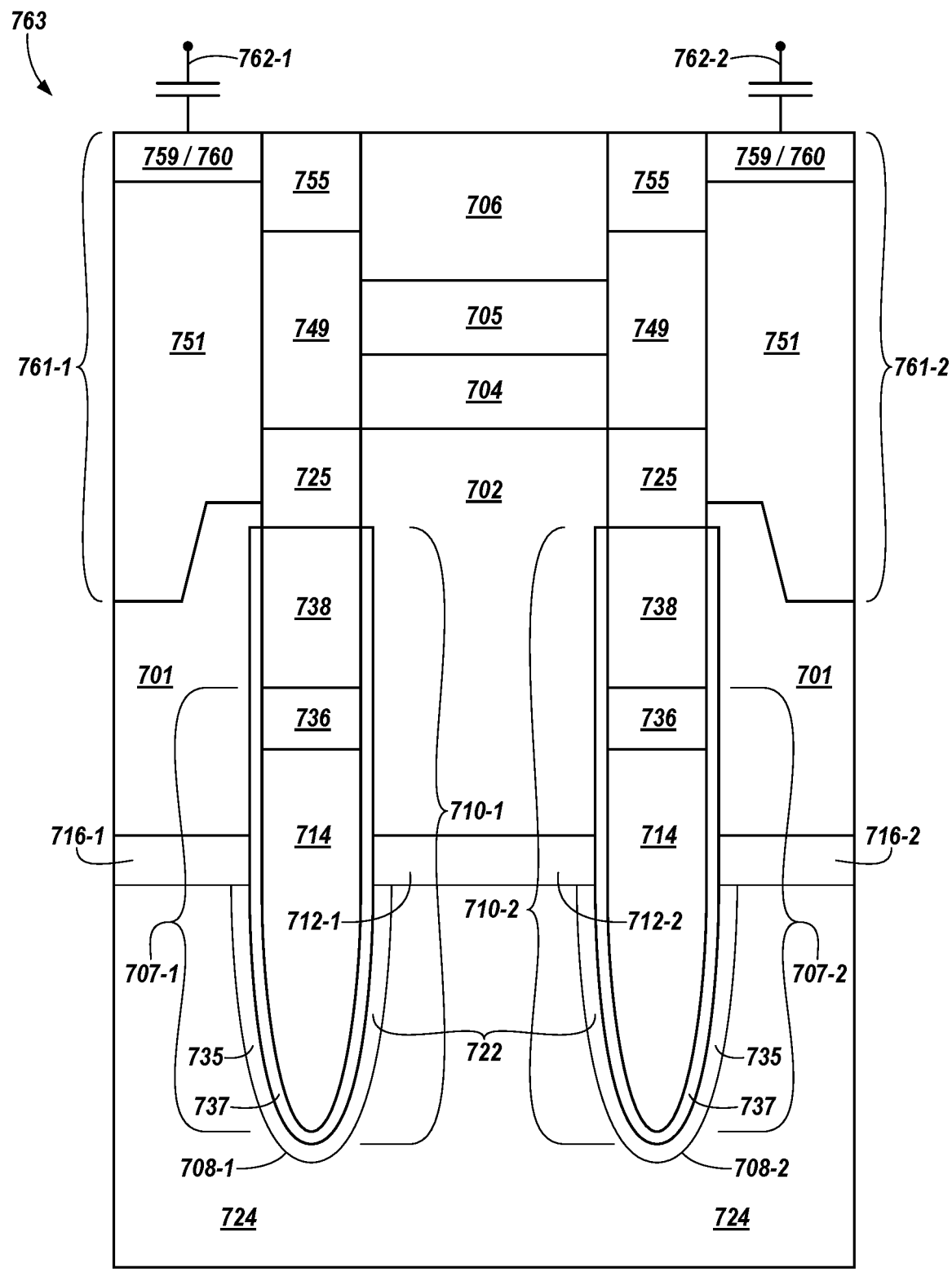
FIG. 7 illustrates a cross-sectional view of a portion of an example of semiconductor structures of a memory device in accordance with a number of embodiments of the present disclosure.

FIG. 7 illustrates a cross-sectional view of a portion of an example of semiconductor structures of a memory device 763 in accordance with a number of embodiments of the present disclosure. The numbering convention used in connection with FIG. 7 does not follow the earlier introduced numbering convention and sequence that applies to FIGS. 1-6. The presence, size, and positioning of the features illustrated in FIG. 7 are shown for clarity and not by way of limitation. As such, a number of features shown and described in connection with other figures herein may be omitted and the size and positioning of other features may be changed relative to the other figures.

The illustrated memory device 763 is shown by way of example to include two BRADs 708-1 and 708-2 (collectively referred to as BRAD 708), although such memory devices are not so limited. Each of the BRADs 708 may include a respective gate 707-1, 707-2 (collectively referred to as gate 707). The gate 707 may also be referred to as a gate electrode. In the example shown, the gate 707 may include a first portion 714 including a metal (e.g., TiN, among other suitable metals and/or nitrides), and a second portion 736 including a doped polysilicon to form a hybrid metal gate 707. Each gate 707 may be formed in contact with a gate mask material 738.

The gate 707 may be separated from a channel 735, separating a first source/drain region 716-1 and 716-2 (collectively referred to as first source/drain region 716) and a second source/drain region 712-1 and 712-2 (collectively referred to as, and which may be a single shared, second source/drain region 712) by a gate dielectric 737. In the example illustrated in FIG. 7, the two neighboring BRADs 708-1 and 708-2 are shown to share the second source/drain region 712 at a junction 722. The gate dielectric 737 may be formed in contact with the source/drain regions 712 and 716 and the junction 722. The preceding illustrated elements 710-1, 710-2 may, in a number of embodiments, be used in combination to form the two BRADs 708. The BRADs 708 may be formed on (e.g., embedded in) a substrate material 724 (e.g., polysilicon, among other possible silicon materials) to form a portion of the semiconductor memory device 763.

A sense line 705 may be coupled to the first source/drain region 716 of each of the BRADs 708 and two storage nodes 762-1 and 762-2 (collectively referred to as storage node 762) may be coupled to the second source/drain region 712. Silicon-based materials (e.g., an undoped silicon material 701 and a polysilicon material 702, among other possibilities) and a nitride material and/or a dielectric material 725 may be formed over (e.g., in contact with) the gate mask material 738 and the gate dielectric 737.

As described in connection with FIG. 1A and elsewhere herein, the sense line 705 may be formed from a conductive material over (e.g., on) a portion 704 of the memory device 763 formed on a doped silicon material. An insulation region 706 formed from a nitride material may be formed over (e.g., on) the sense line 705. A combination of the stacked portion 704, sense line 705, and insulation region 706 may form a sense line pillar (e.g., as shown at 108 and described in connection with FIG. 1A and elsewhere herein).

As described in connection with FIG. 1L and elsewhere herein, the sense line 705 of the sense line pillar 108 may be formed adjacent, and in contact with, for example, two oxide only spacers 749-1 and 749-2 (collectively referred to as oxide only spacer 749). Each oxide only spacer 749 may be formed adjacent, and in contact with, a storage node contact region 761-1 and 761-2 (collectively referred to as storage node contact region 761) in an active region of the memory device 763.

The sense line 705 may be conductively connected to the storage node contact region 761 to enable a storage node 762 to be sensed by the sense line 705. As described in connection with FIG. 1O and elsewhere herein, each storage node contact region 761 may include a storage node contact 751-1 and 751-2 (collectively referred to as storage node contact 751) formed from a storage node contact material such as doped silicon. Each storage node contact region 761 also may, in a number of embodiments, include a liner material 759 formed from a dielectric material over (e.g., on) walls formed from a nitride material 755 and an upper surface of the storage node contact material 751. Each storage node contact region 761 also may include a conductive material 760 that may be formed over a top of the storage node contact material 751 to enable conductive contact with the storage node 762.

In the above detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. Moreover, the structural features illustrated in the accompanying drawings are intended to indicate relative positioning of the structural features in one or more embodiments and are not necessarily drawn to scale relative to other structural features in the drawings or otherwise.

It is to be understood that the terminology used herein is for the purpose of describing particular embodiments only and is not intended to be limiting. As used herein, the singular forms "a", "an", and "the" include singular and plural referents, unless the context clearly dictates otherwise, as do "a number of", "at least one", and "one or more" (e.g., a number of oxide only spacers may refer to one or more oxide only spacers), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically for access to and/or for movement (transmission) of instructions (e.g., control signals, address signals, etc.) and data, as appropriate to the context.

While example embodiments including various combinations and configurations of structural materials, conductive materials, insulating materials, oxide materials, nitride materials, semiconductor materials, substrate materials, dielectric materials, capacitor materials, memory devices, and/or memory cells, among other materials and/or components related to capacitance reduction in a semiconductor device, have been illustrated and described herein, embodiments of the present disclosure are not limited to those combinations explicitly recited herein. Other combinations and configurations of the structural materials, conductive materials, insulating materials, oxide materials, nitride materials, semiconductor materials, substrate materials, dielectric materials, capacitor materials, memory devices, and/or memory cells, among other materials and/or components related to capacitance reduction in a semiconductor device than those disclosed herein are expressly included within the scope of this disclosure.

Although specific embodiments have been illustrated and described herein, those of ordinary skill in the art will appreciate that an arrangement calculated to achieve the same results may be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
   forming an oxide only spacer over a portion of a sense line, formed over a semiconductor substrate, to separate the sense line from a storage node contact region of a semiconductor device and to reduce a capacitance between the sense line and the storage node contact region;
   forming the storage node contact region in an active area of the semiconductor device neighboring the sense line;
   conductively connecting the sense line to the storage node contact region to enable a storage node to be sensed by the sense line; and
   forming, over a working surface of the semiconductor device, a plurality of rail pillars to intersect with a plurality of sense line pillars having a first oxide material deposited, as a first portion of the oxide only spacer, over surfaces of the plurality of sense line pillars.

2. The method of claim 1, further comprising conductively connecting the sense line to a buried recessed access device (BRAD) in the active area of the semiconductor device.

3. The method of claim 1, further comprising forming the semiconductor device in a dynamic random access memory (DRAM) array.

4. The method of claim 1, further comprising:
   forming a plurality of openings within walls formed from the respective plurality of the rail pillars that intersect with the respective plurality of the sense line pillars;
   depositing a second oxide material over the walls of the openings such that the second oxide material is deposited over the first portion as a second portion of the oxide only spacer; and
   reducing, by the oxide only spacer formed from the first and second portions of the oxide materials, a capacitance of a sense line in a sense line pillar relative to a nitride material deposited as a spacer over a surface of the sense line pillar.

5. The method of claim 4, further comprising depositing the first oxide material and the second oxide material that form the oxide only spacer under reducing conditions, in a chamber of a processing apparatus, relative to ambient conditions outside the chamber.

6. The method of claim 4, further comprising etching the oxide only spacer to a particular thickness over the walls of the opening.

7. The method of claim 4, further comprising etching the oxide only spacer to a particular distance below a top of an opening within the walls.

8. The method of claim 4, further comprising:
   performing a dry clean process to remove residual oxide materials and residual silicon resulting from performance of a dry etch process; and
   reducing a potential for unintended removal of the oxide materials of the oxide only spacer relative to use of a wet etch process or a wet clean process.

9. The method of claim 4, further comprising performing an etch process, through a top of an opening within the walls, to a particular depth into silicon below a working surface at a bottom of the opening to create a deeper storage node contact.

10. The method of claim 9, further comprising:
    depositing a doped silicon to form the storage node contact over the silicon at the particular depth and over the oxide only spacer to a particular height in the opening; and
    reducing, by the oxide only spacer, a sense line-to-storage node contact capacitance relative to a spacer formed to include a nitride.

11. The method of claim 10, further comprising:
    filling the opening substantially to, or above, a level of a top surface of an insulation region of a sense line pillar;
    performing a chemical mechanical planarization (CMP) process to planarize the doped silicon to the level of the top surface of the insulation region; and
    performing an etch process, following the CMP process, to etch the doped silicon remaining in the openings to the particular height below a top of the oxide only spacer.

12. The method of claim 9, further comprising:
    epitaxially growing a doped silicon to form the storage node contact over the silicon at the particular depth and over the oxide only spacer to a particular height in the opening;
    reducing, by the oxide only spacer, a sense line-to-storage node contact capacitance relative to a spacer formed to include a nitride; and
    reducing, by the storage node contact being grown epitaxially, a contact resistance between the doped silicon and the silicon.

13. The method of claim 1, further comprising maintaining the semiconductor device under vacuum in one or more chambers of a processing apparatus through completion of performance of an etch process, a clean process, or an epitaxial growth process.

14. The method of claim 1, further comprising maintaining the semiconductor device under vacuum following a last etch, a last clean, or a last epitaxial growth process, including during processes performed by movement to a different chamber of the processing apparatus or elsewhere.

15. A method, comprising:
    forming a first nitride material to cover a surface of a sense line pillar and to fill a trench, in a semiconductor material, adjacent the sense line pillar;
    removing a first portion of the first nitride material to expose the surface of the sense line pillar;
    leaving a second portion of the first nitride material to remain in the trench;
    forming a first oxide material over the exposed surface of the sense line pillar, over the second portion of the first nitride material, and over the semiconductor material;
    removing a first portion of the first oxide material to expose a portion of the first nitride material that remains in the trench and a portion of the semiconductor material;
    leaving a second portion of the first oxide material to cover the surface of the sense line pillar; and
    reducing, by the second portion of the first oxide material, a capacitance of a sense line in the sense line pillar relative to the first nitride material formed over the surface of the sense line pillar.

16. The method of claim 15, further comprising:
    forming a second nitride material as a cap over the second portion of the first oxide material that covers the surface of the sense line pillar; and
    protecting, by the cap, the second portion of the first oxide material from unintended consequences during subsequent processing to form a semiconductor device.

17. The method of claim 15, further comprising:
    forming a plurality of rail pillars to intersect with a respective plurality of sense line pillars, wherein the respective plurality of sense line pillars has the second portion of the first oxide material deposited over surfaces thereof;

forming a plurality of openings having a first cross-sectional area within walls formed from the plurality of the sense line pillars, having the second portion of the first oxide material formed thereon, and from the respective plurality of the rail pillars; and forming a second oxide material over the walls of the openings.

18. The method of claim 17, further comprising:

forming the second oxide material over the walls of the openings to:
increase a total thickness, formed on surfaces of the sense line pillars, of the first and second oxide materials; and
decrease the first cross-sectional area to a second cross-sectional area.

19. The method of claim 17, further comprising:

forming a storage node contact material over the second oxide material to fill an opening within the walls to a particular level;

reducing a height of the second oxide material formed over the rail pillars and a height of both the first oxide material and the second oxide material formed over the sense line pillars to be below the particular level of the storage node contact material;

forming a second nitride material in the opening to fill a gap between sides of the storage node contact material and the rail and sense line pillars created by reducing the height of the oxide materials;

leaving a remainder of the heights of both the first oxide material and the second oxide material as an oxide only spacer between, and in contact with, the sense line and the storage node contact material; and reducing, by a remainder of a height of the oxide only spacer, a sense line-to-storage node contact capacitance relative to a spacer formed to include a nitride.

20. The method of claim 19, further comprising:

uncovering surfaces of the rail pillars and the sense line pillars, above the reduced height of the oxide only spacer, by the reduction of the height of the oxide materials to below the particular level of the storage node contact material;

forming the second nitride material over the uncovered surfaces of the rail pillars and the sense line pillars above the reduced height of the oxide only spacer such that a bottom of an aperture, having walls formed from the second nitride material, exposes a top of a storage node contact formed from the storage node contact material;

forming the aperture to have the walls, formed from the second nitride material, extend from above the reduced height of the oxide only spacer to a top of the rail pillars and the sense line pillars; and forming a conductive material in the aperture, over the top of the storage node contact, to enable conductive contact with a storage node.

21. An apparatus, comprising:

a sense line coupled to a source/drain region of a semiconductor device;

an oxide only spacer formed over a portion of the sense line, formed over a semiconductor substrate, to separate the sense line from a storage node contact region of a semiconductor device and to reduce a capacitance between the sense line and the storage node contact region relative to a spacer that includes a nitride;

the storage node contact region in an active area of the semiconductor device neighboring the sense line, wherein the sense line is conductively connected to the storage node contact region to enable the storage node to be sensed by the sense line; and a plurality of rail pillars to intersect with a plurality of sense line pillars having a first oxide material deposited, as a first portion of the oxide only spacer, over surfaces of the plurality of sense line pillars.

22. The apparatus of claim 21, wherein the nitride of the spacer is in contact with at least one of the sense line and the storage node contact region.

23. The apparatus of claim 21, wherein the nitride of the spacer is between two oxides of the spacer.

24. The apparatus of claim 21, wherein a particular oxide material used in the oxide only spacer has a lower dielectric constant than a particular nitride material used in the spacer that includes the nitride.

25. The apparatus of claim 21, wherein the oxide only spacer is a dielectric that comprises silicon dioxide.

26. The apparatus of claim 21, wherein the storage node contact region includes a semiconductor that comprises a doped silicon.

27. The apparatus of claim 21, wherein the sense line is a conductive material that comprises tungsten.

28. The apparatus of claim 21, wherein the sense line is positioned between an insulation region and a semiconductor material in the sense line pillar.

29. The apparatus of claim 28, wherein:
the insulation region comprises a silicon nitride; and
the semiconductor material comprises a doped silicon.

* * * * *